(12) United States Patent
Wang et al.

(10) Patent No.: US 9,252,113 B2
(45) Date of Patent: Feb. 2, 2016

(54) NO-EXPOSED-PAD BALL GRID ARRAY (BGA) PACKAGING STRUCTURES AND METHOD FOR MANUFACTURING THE SAME

(71) Applicant: Jiangsu Changjiang Electronics Technology Co., Ltd., Wuxi (CN)

(72) Inventors: Xinchao Wang, Wuxi (CN); Zhizhong Liang, Wuxi (CN)

(73) Assignee: JIANGSU CHANGJIANG ELECTRONICS TECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 14/259,139

(22) Filed: Apr. 22, 2014

(65) Prior Publication Data

US 2014/0312476 A1    Oct. 23, 2014

Related U.S. Application Data

(63) Continuation-in-part of application No. PCT/CN2012/000020, filed on Jan. 6, 2012.

(30) Foreign Application Priority Data

Nov. 30, 2011    (CN) .......................... 2011 1 0389700

(51) Int. Cl.
*H01L 21/00*    (2006.01)
*H01L 23/00*    (2006.01)
(Continued)

(52) U.S. Cl.
CPC ............ *H01L 24/17* (2013.01); *H01L 21/4832* (2013.01); *H01L 23/495* (2013.01); *H01L 23/49575* (2013.01); *H01L 23/49582* (2013.01); *H01L 23/49589* (2013.01); *H01L 24/11* (2013.01); *H01L 24/49* (2013.01); *H01L 24/97* (2013.01); *H01L 21/561* (2013.01); *H01L 23/3107* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/2919* (2013.01); *H01L 2224/451* (2013.01); *H01L 2224/48091* (2013.01); *H01L 2224/48137* (2013.01); *H01L 2224/48247* (2013.01); *H01L 2224/49171* (2013.01); *H01L 2224/73265* (2013.01); *H01L 2224/85444* (2013.01); *H01L 2224/92247* (2013.01); *H01L 2224/97* (2013.01);

(Continued)

(58) Field of Classification Search
USPC ..... 438/111, 112, 123, FOR. 368, FOR. 367, 438/FOR. 377, FOR. 380; 257/E23.004, 257/E23.043–E23.05
See application file for complete search history.

(56) References Cited

U.S. PATENT DOCUMENTS 8,735,224 B2 *   5/2014   Do et al. ........................ 438/123
2012/0038036 A1 *   2/2012   Chun et al. ..................... 257/677

*Primary Examiner* — Jasmine Clark
(74) *Attorney, Agent, or Firm* — Matthias Scholl P.C.; Matthias Scholl

(57) ABSTRACT

A no-exposed-pad ball grid array (BGA) packaging structure includes a metal substrate, a first die coupled to a top surface of the metal substrate, and a plurality of outer leads formed on the metal substrate and extending to the proximity of the die. A metal layer that contains a plurality of inner leads corresponding to the plurality of outer leads and extending to the proximity of the die is formed on the metal substrate by a multi-layer electrical plating process such that a lead pitch of the plurality of inner leads is significantly reduced. Furthermore, the die and the plurality of inner leads are connected by metal wires, and a plurality of solder balls is attached to a back surface of the plurality of outer leads and a die pad. The die, the plurality of inner leads, and the metal wires are sealed with a molding compound.

6 Claims, 36 Drawing Sheets

(51) Int. Cl.
*H01L 23/495* (2006.01)
*H01L 21/48* (2006.01)
H01L 23/31 (2006.01)
H01L 21/56 (2006.01)

(52) U.S. Cl.
CPC .............. *H01L 2924/01322* (2013.01); *H01L 2924/07802* (2013.01); *H01L 2924/181* (2013.01); *H01L 2924/19105* (2013.01); *H01L 2924/30107* (2013.01)

NO-EXPOSED-PAD BALL GRID ARRAY (BGA) PACKAGING STRUCTURES AND METHOD FOR MANUFACTURING THE SAME

CROSS-REFERENCES TO RELATED APPLICATIONS

This application is a continuation-in-part of International Patent Application No. PCT/CN2012/000020 with an international filing date of Jan. 6, 2012, designating the United States, now pending, and further claims priority benefits to Chinese Patent Application No. 201110389700.0 filed Nov. 30, 2011. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

1. Field of the Invention

The invention relates to the field of semiconductor assembly or packaging and, more particularly, to ball grid array (BGA) packaging technologies.

2. Description of the Related Art

There are mainly two types of conventional lead frame structures used in semiconductor packaging processes. For the first type, as shown in FIG. 49, after performing chemical etching and electrical plating (or simply plating) on the metal substrate, a layer of high-temperature resistant film is affixed on the back surface of the metal substrate to form the lead frame carrier to be used in the packaging process.

For the second type, as shown in FIG. 51, chemical half etching is first performed on the back surface of the metal substrate, and the chemically half etched areas are sealed with encapsulation material. Further, chemical half etching for inner leads is performed on the top surface of the metal substrate and followed by plating on the surface of inner leads of the lead frame so as to complete the lead frame.

However, both of these two types of lead frames may have certain disadvantages in the packaging process. For example, for the first type, the issues may include:

1) Because an expensive high-temperature film must be affixed on the back surface of the metal substrate, the manufacturing cost is directly increased;
2) In the die attaching process of the packaging process, also because a high-temperature resistant film must be affixed on the back surface of the metal substrate, only epoxy may be used in the die attaching process, and certain techniques such as the eutectic process or soft solder technique cannot be used, which greatly limits choices of available products;
3) In the wire bonding process of the packaging process, also because a high-temperature resistant film must be affixed on the back surface of the metal substrate and the high-temperature resistant film is a kind of soft material, the wire bonding parameters may become unstable, which seriously impacts on the quality of wire bonding and the reliability and stability of the product; and
4) In the molding process, also because a high-temperature resistant film must be affixed on the back surface of the metal substrate, the molding pressure during the molding process may cause certain mold bleeding between the lead frame and the high-temperature resistant film, which may change a conductive metal lead into an insulated lead, as shown in FIG. 50 (certain metal leads on the left side of the drawing are insulated by bleeding material).

For the second type conventional lead frame structure, the issues may include:

1) Because the etching process was carried out twice, manufacturing cost may be increased;
2) Because the composition of the lead frame is metal material and compound, when operated in a high and low temperature environment, the lead frame may be warping due to the different expansion and shrinkage stress of the different materials;
3) The warpage of the lead frame may impact the accuracy of die attaching process and may also affect the production yield due to the impact on the smooth transferring of the warping lead frames in the die attaching process;
4) The warpage of the lead frame may also impact the alignment accuracy of the wire bonding and may also affect the production yield due to the impact on the smooth transferring of the warping lead frames in the wire bonding process; and
5) Because the inner leads on the top surface of the lead frame are formed using etching technique, the width of the inner leads might have to be greater than 100 μm and the distance between two adjacent inner leads also must have to be greater than 100 μm. Thus, it may be difficult to achieve high density for the inner leads.

SUMMARY OF THE INVENTION

In view of the above-described problems, it is one objective of the invention to provide a no-exposed-pad ball grid array (BGA) packaging structure for solving one or more problems set forth above and other problems. The no-exposed-pad BGA packaging structure includes a metal substrate, a first die coupled to a top surface of the metal substrate, and a plurality of outer leads formed based on the metal substrate. The no-exposed-pad BGA packaging structure also includes a metal layer, which contains a plurality of inner leads corresponding to the plurality of outer leads and extending to proximity of the die and is formed on the metal substrate by a multi-layer electrical plating process such that a lead pitch of the plurality of inner leads is significantly reduced. Further, the no-exposed-pad BGA packaging structure includes metal wires connecting the die and the plurality of inner leads, and a plurality of solder balls attached to a back surface of the plurality of outer leads and the die pad. The die, the plurality of inner leads, and metal wires are sealed with a molding compound.

Another objective of the invention is to provide a method for manufacturing a no-exposed-pad ball grid array (BGA) packaging structure. The method includes providing a metal substrate, forming a first photoresist film on a top surface of the metal substrate, and forming a plating pattern in the first photoresist film using photolithography. The method also includes forming a metal layer containing a plurality of inner leads by a multi-layer electrical plating process using the plating pattern in the first photoresist film as a mask, such that a lead pitch of the plurality of inner leads is significantly reduced. Further, the method includes attaching at least one die in a predetermined region on the top surface of the metal substrate, and connecting the die and the plurality of inner leads using metal wires by a wire bonding process. The method also includes sealing the die, the plurality of inner leads, and metal wires with a molding compound, and etching the metal substrate from a back surface of the metal substrate to form a plurality of outer leads corresponding to the plurality of inner leads. In addition, the method includes attaching a plurality of solder balls to a back surface of the plurality of outer leads.

Figure 1:
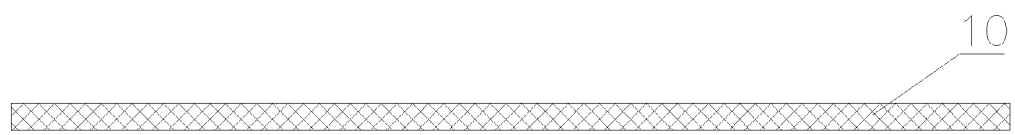
FIG. 1 illustrates a step of an exemplary process for manufacturing an exemplary no-exposed-pad BGA packaging structure consistent with the disclosed embodiments in which a metal substrate is provided for the lead frame manufacturing and packaging process.

In the drawings, the following reference numbers are used: 1. outer lead; 2. inner die pad; 3. inner lead; 4. die; 5. metal wire; 6. encapsulation material; 7. conductive or non-conductive adhesive material; 8. solder ball; 9. sealant; 10. metal substrate; 11 and 12. photoresist films; 13. first metal layer; 14. passive device; 15. outer electrostatic discharge ring; and 16. inner electrostatic discharge ring.

DETAILED DESCRIPTION OF THE EMBODIMENTS

Figure 17A:
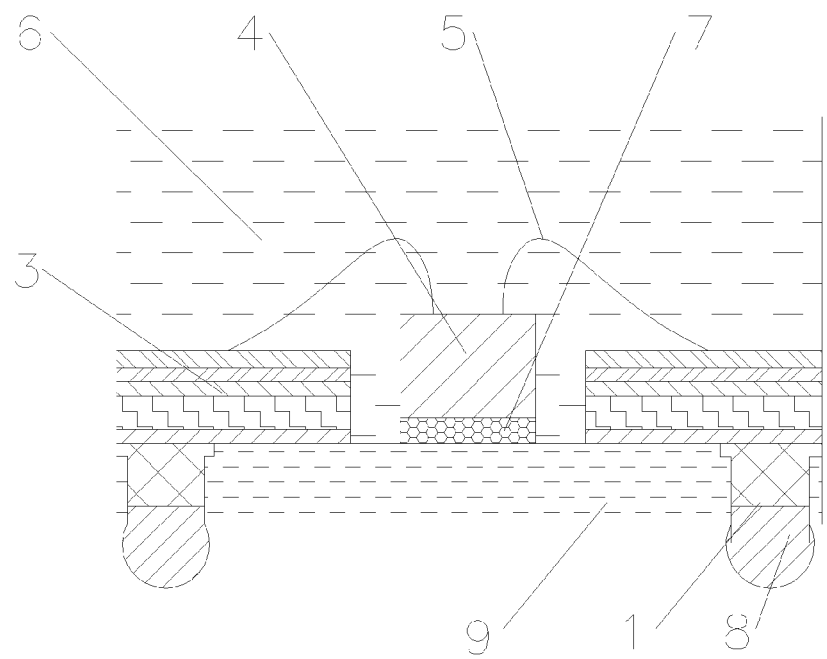
FIG. 17A is a cross-sectional view of an exemplary no-exposed-pad BGA packaging structure consistent with the disclosed embodiments.
Figure 17B:
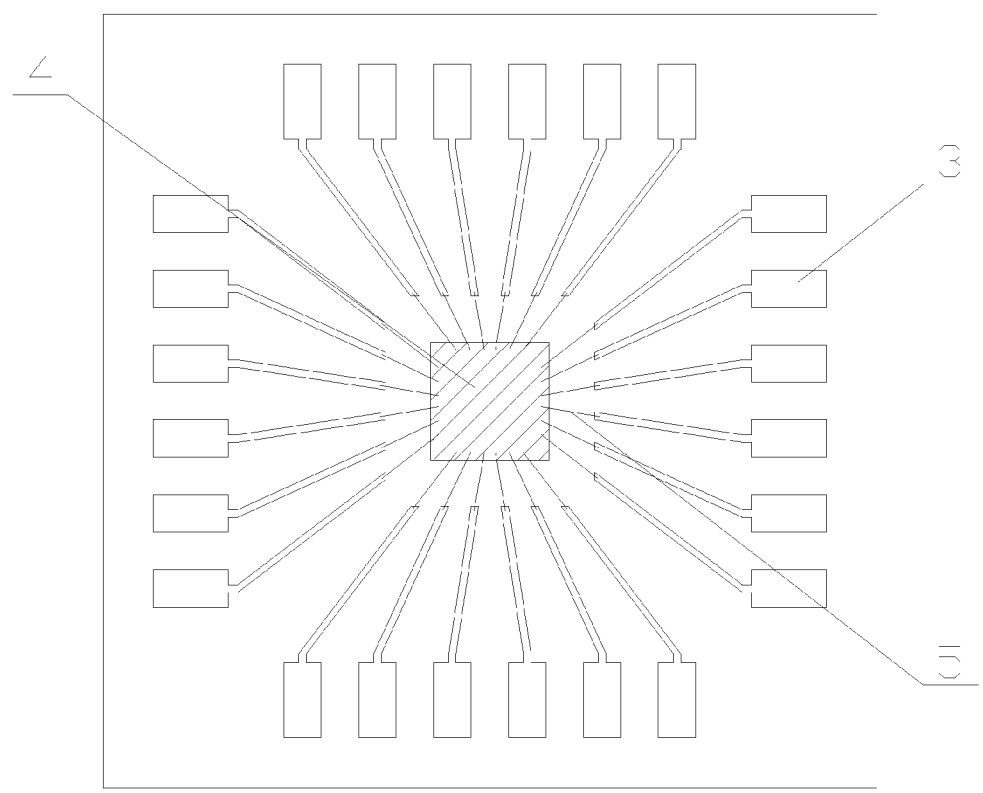
FIG. 17B is a top view of the exemplary no-exposed-pad BGA packaging structure of FIG. 17A.

FIG. 17A and FIG. 17B illustrate an exemplary no-exposed-pad ball grid array (BGA) packaging structure consistent with the disclosed embodiments. FIG. 17A is a cross-sectional view of FIG. 17B. A no-exposed-pad BGA packaging structure, as used herein, may refer to a BGA packaging structure that does not have an outer die pad on the back surface of the BGA packaging structure.

As shown in FIG. 17A and FIG. 17B, the no-exposed-pad BGA packaging structure includes a plurality of outer leads 1, a plurality of inner leads 3, a die 4, metal wire(s) 5, and an encapsulation material 6, such as an EMC compound. Certain components may be omitted and other components may be added.

The die 4 may include any pre-made semiconductor chip to be assembled or packaged. The outer leads 1 may include a plurality of metal pads or traces (e.g., outer lead pads) to provide external connections to the die 4 or any other components inside the no-exposed-pad BGA packaging structure through the inner leads 3. The outer leads 1 may in any appropriate shape, such as a rectangle. The plurality of leads of the outer leads 1 may be arranged in an array configuration or any other appropriate configuration. For example, in certain embodiments, as shown in FIG. 17B, the outer leads 1 are arranged in a single ring configuration.

The die 4 may be mounted on the top surface of a substrate or other planar supporting structure through a conductive or non-conductive adhesive material 7, such as epoxy, soft solder, or other conductive or non-conductive material. Further, from the top surface of the outer leads 1, an electrical plating (or simply plating) process such as multi-plating may be used to form the inner leads 3. More specifically, multiple layers may be formed by plating such that the distance between adjacent inner leads (i.e., inner lead pitch) may be substantially reduced. The top surface of the inner leads 3 and the top surface of die 4 may be connected by the metal wires 5. Further, the inner leads 3 may be formed significantly close to the die 4 via lead traces, such that the length of metal wires 5 connecting the die 4 to the inner leads 3 may also be substantially reduced.

All inner leads 3 may be referred as a first metal layer. That is, the first metal layer includes all leads of the inner leads 3 or the inner leads 3 are formed as part of the metal layer. The inner leads 3, the die 4, and the metal wires 5 are covered with an encapsulation material 6, such as an EMC compound. Further, at the backside of the substrate, a sealant 9 is filled in the peripheral areas of the outer leads 1 and the area between adjacent outer leads 1. The back surfaces of the outer leads 1 are below the surface of the sealant 9 but are exposed from the sealant 9 and the solder balls 8 are formed on the back surface of the outer leads 1. The sealant 9 may include any appropriate type of sealant, such as a no-filler compound or a small-filler compound.

The process for manufacturing the above described packaging structure may be explained below in detail with corresponding FIGS. 1-16. The process may be used to make a plurality of components (packaged ICs). Because each component or packaged IC may be made in a same way, only a single packaged IC or BGA packaging structure may be described for illustrative purposes.

As shown in FIG. 1, at the beginning, a metal substrate 10 is provided for the lead frame manufacturing and packaging process. The metal substrate 10 may have a desired thickness and be made from various metal materials depending on particular types of the die 4. For example, the metal substrate 10 may be made from one of copper, aluminum, iron, copper alloy, stainless steel, or nickel-iron alloy. Other materials may also be used.

Figure 2:
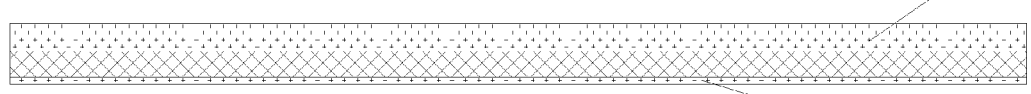
FIG. 2 illustrates another step of the exemplary process for manufacturing the exemplary no-exposed-pad BGA packaging structure in which layers of photoresist film are formed on the top surface and the back surface of the metal substrate.

Further, as shown in FIG. 2, a layer of photoresist film 11 and a layer of photoresist film 12 may be formed (pasted or coated) on the top surface and the back surface of the metal substrate 10, respectively. The photoresist film 11 and/or photoresist film 12 may be formed using various ways. For example, the photoresist film 11 and/or the photoresist film 12 may be coated on the surface or may be pasted on the surface. The photoresist films 11 and 12 may be used to protect the metal substrate 10 in subsequent plating processes, and the photoresist films 11 or 12 may include a dry photoresist film or a wet photoresist film. Other types of photoresist films may also be used.

Figure 3:
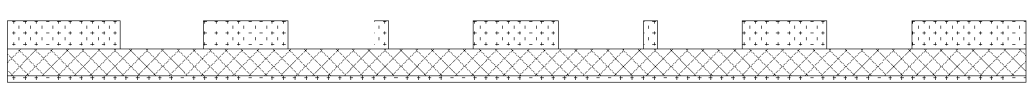
FIG. 3 illustrates another step of the exemplary process for manufacturing the exemplary no-exposed-pad BGA packaging structure in which portions of the photoresist film on the top surface of the metal substrate are removed to form a pattern by photolithography.

Further, as shown in FIG. 3, portions of the photoresist film 11 on the top surface of the metal substrate 10 may be removed to form a pattern by photolithography. As shown in FIG. 3, photolithography equipment may be used to perform exposure, development, and etching on the photoresist film 11 using a corresponding mask to form a plating pattern in the photoresist film 11. The plating pattern may expose the predetermined areas of the metal substrate 10 for subsequent plating process to form the first metal layer 13, i.e., a first metal layer pattern.

Figure 4:
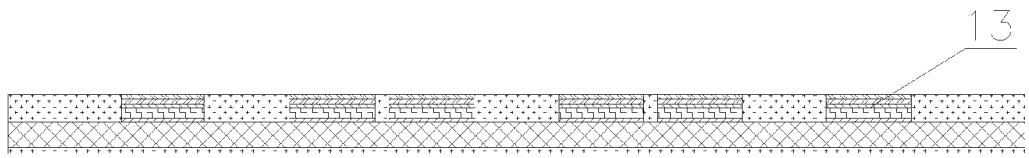
FIG. 4 illustrates another step of the exemplary process for manufacturing the exemplary no-exposed-pad BGA packaging structure in which a multi-layer plating process is performed to form a first metal layer in the areas of the metal substrate exposed by the plating pattern in the photoresist film.

After forming the plating pattern or the first metal layer pattern, as shown in FIG. 4, a multi-layer plating process may be performed to form the first metal layer 13 in the areas of the metal substrate 10 exposed by the plating pattern in the photoresist film 11. In other words, the multi-layer plating process is performed on the top surface of the metal substrate 10 using the pattern in the photoresist film 11 as a mask to form inner leads 3 (the first metal layer 13). The inner leads 3 may be formed corresponding to the outer leads 1 and may also be arranged in a corresponding shape (e.g., a rectangle) and configuration (e.g., a single ring configuration). Other shapes and configurations may also be used.

Because the inner leads 3 are formed by the plating process, the lead pitch of the inner leads 3 and the distance between the inner leads 3 and the die 4 may be substantially reduced. For example, the inner leads 3 may be formed by a thin-line plating method on the top surface of the metal substrate 10. The width of the inner leads 3 may be approximately 25 µm, and the lead pitch of the inner leads 3 may also be approximately 25 µm. Comparing with the lead pitch of about 100 µm in conventional lead frames, the width of the inner leads 3 and the lead pitch of the inner leads 3 may be significantly reduced, which may achieve a high density for the inner leads 3. Further, the inner leads 3 may extend to the proximity of the die 4 via lead traces. Using the plating process, the distance between the die 4 and the inner leads 3 can also be significantly reduced such that the inner leads 3 can extend substantially close to the die 4, which can substantially reduce the package size.

The first metal layer 13 (e.g., the inner leads 3) may include any appropriate number of layers of metal materials and/or metal layer structures. For example, the first metal layer 13 may include, from bottom to the top, a total of five layers of nickel, copper, nickel, palladium, and gold, respectively, or a total of three layers of nickel, copper, and silver. Other materials and numbers of layers and/or layer structures may also be used.

Different metal layers in the first metal layer 13 may provide different functionalities. For example, in a five-layer structure (nickel, copper, nickel, palladium, and gold), the bottom layer of nickel may be used as an erosion resistant and barrier layer, the middle layers of copper, nickel and palladium may be used to increase the thickness of the first metal layer 13, and the top layer of gold may be used for wire bonding. Other functionalities may also be provided and other metal layer structures may also be used.

Figure 5:
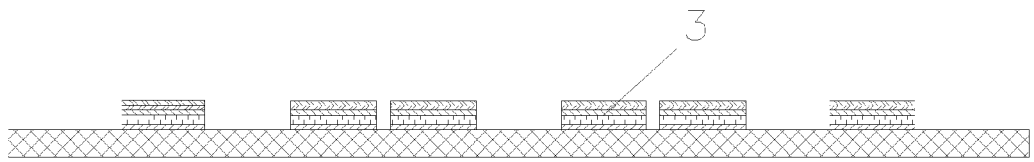
FIG. 5 illustrates another step of the exemplary process for manufacturing the exemplary no-exposed-pad BGA packaging structure in which the remaining photoresist film on the top surface of the metal substrate is removed and inner leads are formed on the metal substrate.

Further, as shown in FIG. 5, the remaining top surface photoresist film 11 is removed and the inner leads 3 are formed on the metal substrate 10. The back surface photoresist film 12 is also removed.

Figure 6:
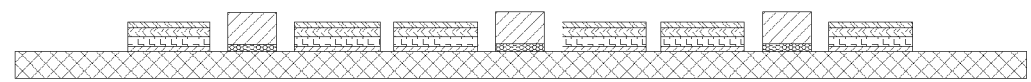
FIG. 6 illustrates another step of the exemplary process for manufacturing the exemplary no-exposed-pad BGA packaging structure in which a die is mounted on a predetermined die area of the metal substrate.
Figure 7:
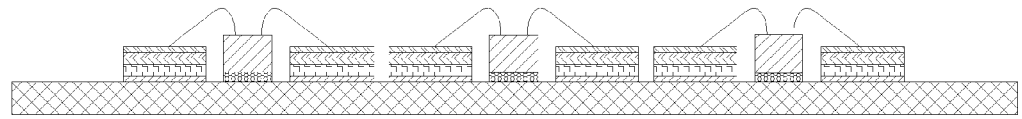
FIG. 7 illustrates another step of the exemplary process for manufacturing the exemplary no-exposed-pad BGA packaging structure in which the top surface of the die and the top surface of the inner leads are connected with metal wires in a wire bonding process.

After removing the photoresist films, the die 4 may be mounted on a predetermined die area of the metal substrate 10 by using the conductive or non-conductive adhesive material 7, as shown in FIG. 6, in a die attaching process. The predetermined die area of the metal substrate 10 may correspond to the area for attaching the die 4. More particularly, the die 4 may be mounted or attached to an area among the inner leads 3 or surrounded by the inner leads 3. The top surface of the die 4 and the top surface of the inner leads 3 are connected with metal wires 5 in a wire bonding process, as shown in FIG. 7.

Figure 8:
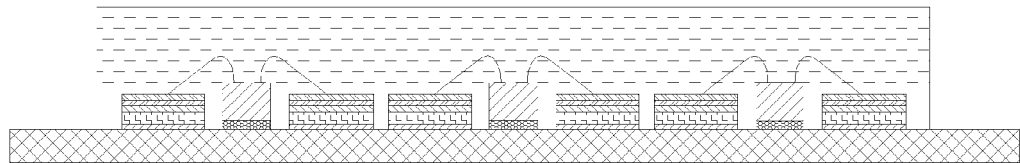
FIG. 8 illustrates another step of the exemplary process for manufacturing the exemplary no-exposed-pad BGA packaging structure in which the inner leads, the die, and the metal wires are encapsulated using an encapsulation material.

The inner leads 3, the die 4, and the metal wires 5 are then encapsulated using encapsulation material 6, as shown in FIG. 8. For example, molding equipment may be used to seal or encapsulate the metal substrate 10 by a molding compound after completing die attaching and wire bonding. Post-molding curing may also be performed such that the molding compound or other encapsulation materials may also be cured before the next manufacturing process.

Figure 9:
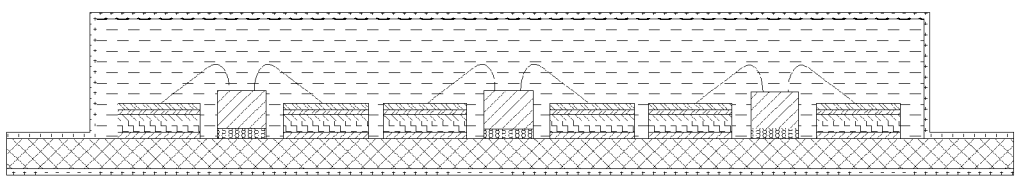
FIG. 9 illustrates another step of the exemplary process for manufacturing the exemplary no-exposed-pad BGA packaging structure in which a layer of photoresist film is formed on the top surface of the metal substrate and another layer of photoresist film is formed on the back surface of the metal substrate.

As shown in FIG. 9, after the plastic encapsulation process (e.g., molding and post-molding curing), a layer of photoresist film 11 may be formed on the top surface of the metal substrate 10 and another layer of photoresist film 12 may be formed on the back surface of the metal substrate 10. The photoresist films may be used to protect the metal substrate 10 in subsequent etching processes, and the photoresist films may include a dry photoresist film or a wet photoresist film. Other types of photoresist films may also be used.

Figure 10:
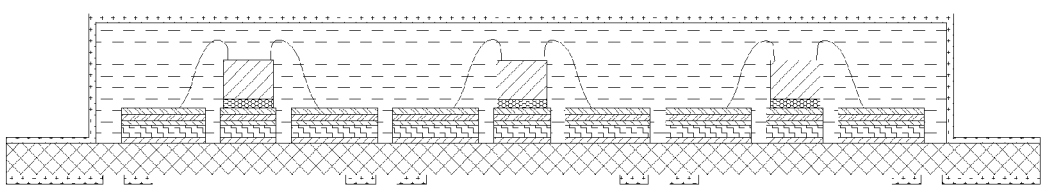
FIG. 10 illustrates another step of the exemplary process for manufacturing the exemplary no-exposed-pad BGA packaging structure in which exposure, development, and etching are carried out on the photoresist film formed on the back surface of the metal substrate to form an etching pattern.

Further, portion of the photoresist film 12 on the back surface of the metal substrate 10 may be removed to form a pattern using photolithography. As shown in FIG. 10, photolithography equipment may be used to perform exposure, development, and etching on the photoresist film 12 on the back surface of the metal substrate 10 by using a corresponding mask to form an etching pattern in the photoresist film 12. The etching pattern may expose the predetermined areas on the back surface of the metal substrate 10 for subsequent etching process to form outer leads 1, i.e., the outer lead pattern.

Figure 11:
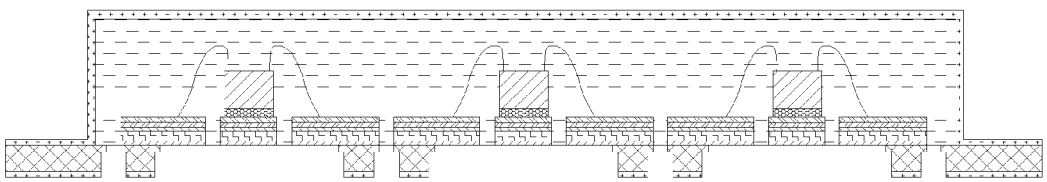
FIG. 11 illustrates another step of the exemplary process for manufacturing the exemplary no-exposed-pad BGA packaging structure in which an etching process is performed on the areas of the metal substrate exposed by the etching pattern in the photoresist film on the back surface of the metal substrate to form etched areas and outer leads.

After forming the etching pattern, as shown in FIG. 11, an etching process may be performed on the areas of the metal substrate 10 exposed by the etching pattern in the photoresist film 12. In other words, the etching process is performed on the metal substrate 10 using the pattern in the photoresist film 12 as a mask. The etching process may be full etching or half etching. Etched areas are thus formed on the back surface of the metal substrate 10, and the outer leads 1 are also formed after the etching process.

Figure 12:
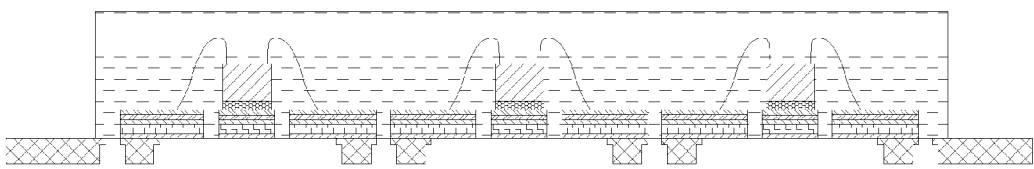
FIG. 12 illustrates another step of the exemplary process for manufacturing the exemplary no-exposed-pad BGA packaging structure in which the remaining photoresist film on the back surface of the metal substrate is removed to expose the etched areas on the back surface of the metal substrate and the photoresist film on the top surface of the metal substrate is also removed.

Further, as shown in FIG. 12, after the etching process, the remaining photoresist film 12 on the back surface of the metal substrate 10 is removed to expose the etched areas on the back surface of the metal substrate 10 including the areas outside and surrounding the outer leads 1 and the areas between the leads of the outer leads 1. The photoresist film 12 on the top surface of the metal substrate 10 is also removed.

Figure 13:
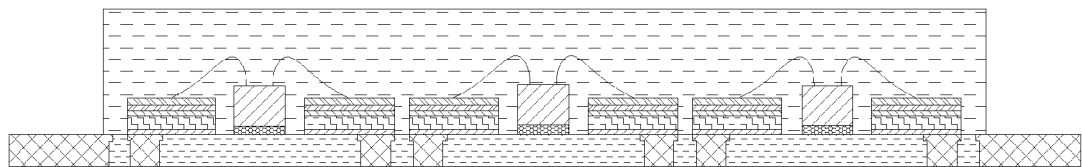
FIG. 13 illustrates another step of the exemplary process for manufacturing the exemplary no-exposed-pad BGA packaging structure in which the etched areas on the back surface of the metal substrate are filled with a sealant.

Afterwards, as shown in FIG. 13, the etched areas on the back surface of the metal substrate 10 are filled with the sealant 9 using filling equipment. Post-molding curing may be performed on the sealant 9. The sealant 9 may include any appropriate sealant, with or without filler, and may also be filled at a certain height. Thus, the outer leads 1 may be supported by both the molding compound 6 and the sealant 9.

Figure 14:
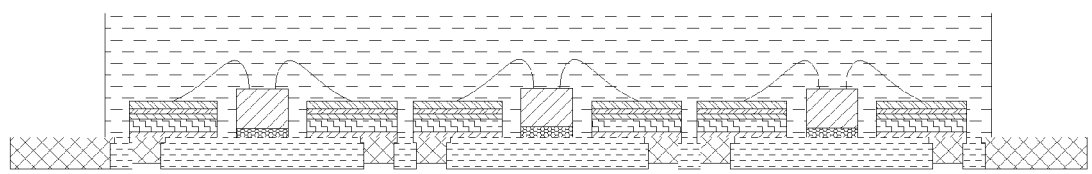
FIG. 14 illustrates another step of the exemplary process for manufacturing the exemplary no-exposed-pad BGA packaging structure in which a micro-etching process is performed on the back surface of the metal substrate.

Further, additionally or optionally, as shown in FIG. 14, a micro-etching process may be performed on the back surface of the metal substrate 10, i.e., the back surface of the outer leads 1, to form micro-etched surface. The micro-etched surface may be slightly below the back surface of the sealant 9.

Figure 15:
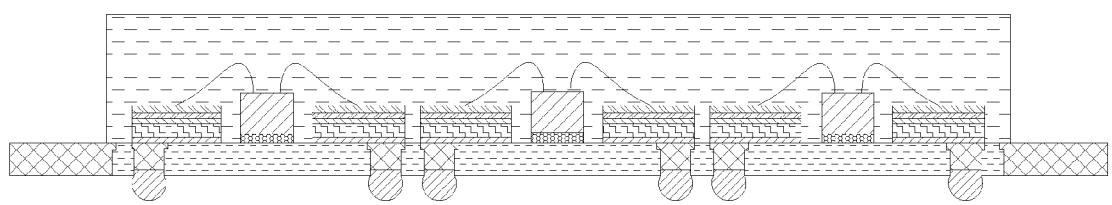
FIG. 15 illustrates another step of the exemplary process for manufacturing the exemplary no-exposed-pad BGA packaging structure in which solder balls are formed on the back surface of the outer leads.

As shown in FIG. 15, solder balls 8 may be formed on the back surface of the outer leads 1. More specifically, solder glue may be filled into the micro-etched back surface of the outer leads 1, and a reflow soldering process may be performed to form solder balls 8 on the back surface of the outer leads 1. Other methods may also be used to form solder balls 8.

Figure 16:
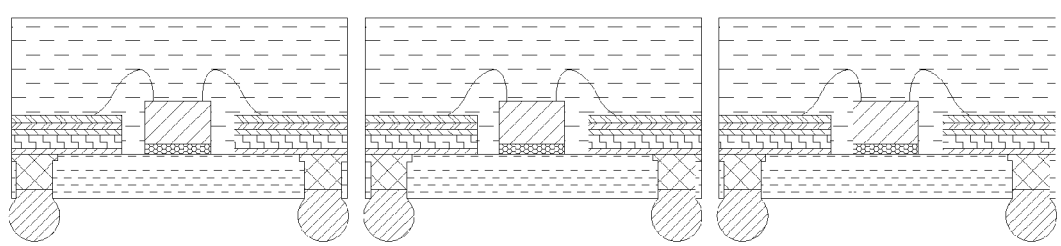
FIG. 16 illustrates another step of the exemplary process for manufacturing the exemplary no-exposed-pad BGA packaging structure in which a plurality of encapsulated components formed on the metal substrate is cut into individual packaged integrated circuits (ICs) or individual no-exposed-pad BGA packaging structures in a package sawing process.

Thus, a no-exposed-pad BGA packaging structure with single lead ring may be formed. Afterwards, as shown in FIG. 16, the plurality of encapsulated components formed on the metal substrate 10 may be individually cut to obtain individual packaged ICs or individual no-exposed-pad BGA packaging structures in a package sawing process. Other cutting methods may also be used.

Figure 18A:
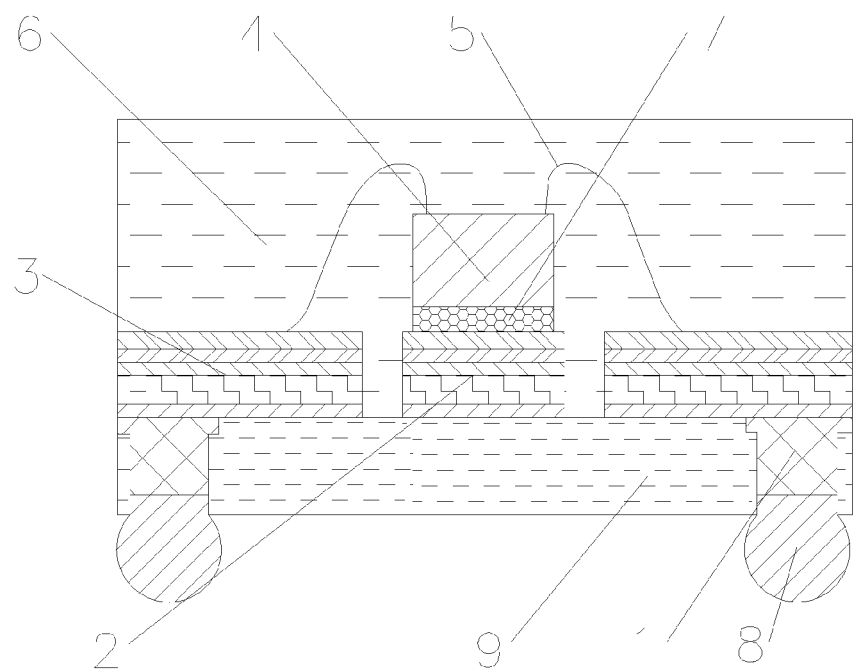
FIG. 18A is a cross-sectional view of another exemplary no-exposed-pad BGA packaging structure consistent with the disclosed embodiments.
Figure 18B:
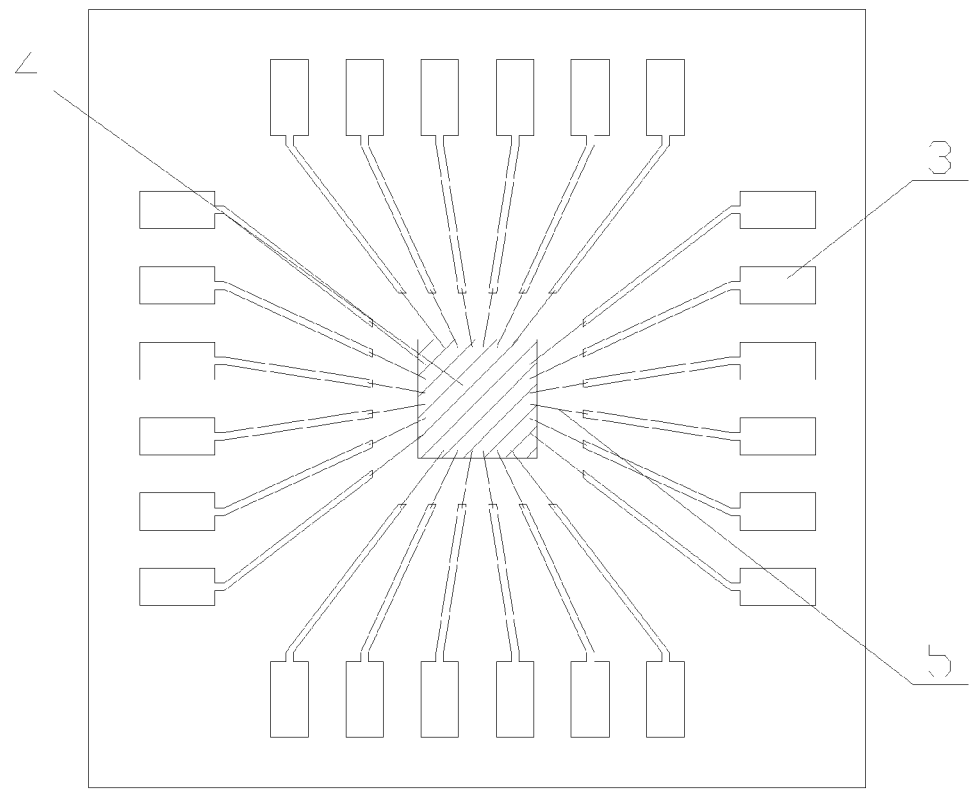
FIG. 18B is a top view of the exemplary no-exposed-pad BGA packaging structure of FIG. 18A.

Further, the no-exposed-pad BGA packaging structure may also include various different structures and configurations. For example, FIG. 18A and FIG. 18B illustrate another exemplary no-exposed-pad BGA packaging structure. FIG. 18A is a cross-sectional view of FIG. 18B.

As shown in FIG. 18A and FIG. 18B, the no-exposed-pad BGA packaging structure in FIG. 18A and FIG. 18B is similar to the no-exposed-pad BGA packaging structure in FIG. 17A and FIG. 17B. However, the no-exposed-pad BGA packaging structure in FIG. 18A also includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad BGA packaging structure with an inner die pad and a single lead ring may be formed.

Figure 19A:
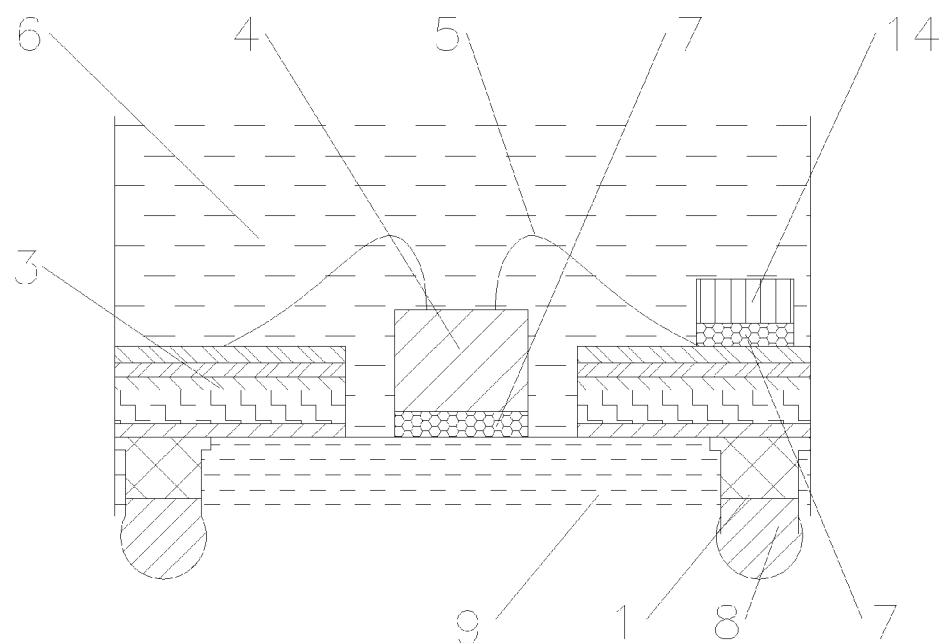
FIG. 19A is a cross-sectional view of another exemplary no-exposed-pad BGA packaging structure consistent with the disclosed embodiments.
Figure 19B:
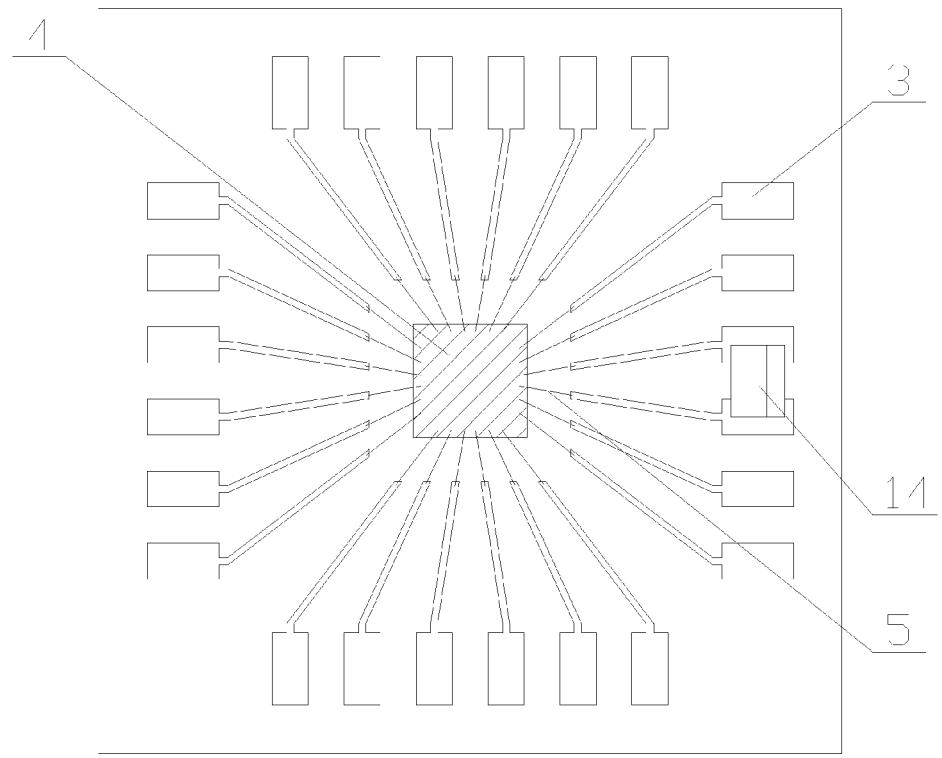
FIG. 19B is a top view of the exemplary no-exposed-pad BGA packaging structure of FIG. 19A.

FIG. 19A and FIG. 19B illustrate another exemplary no-exposed-pad BGA packaging structure. FIG. 19A is a cross-sectional view of FIG. 19B.

As shown in FIG. 19A and FIG. 19B, the no-exposed-pad BGA packaging structure in FIG. 19A and FIG. 19B is similar to the no-exposed-pad BGA packaging structure in FIG. 17A and FIG. 17B. However, the no-exposed-pad BGA packaging structure in FIG. 19A also includes one or more passive devices 14 coupled between the inner leads 3 using a conductive or non-conductive adhesive material 7. The passive devices 14 may be coupled between the inner leads 3 before the die 4 is attached or during the die attaching process. Thus, a no-exposed-pad BGA packaging structure with a single lead ring coupled with passive devices may be formed.

Figure 20A:
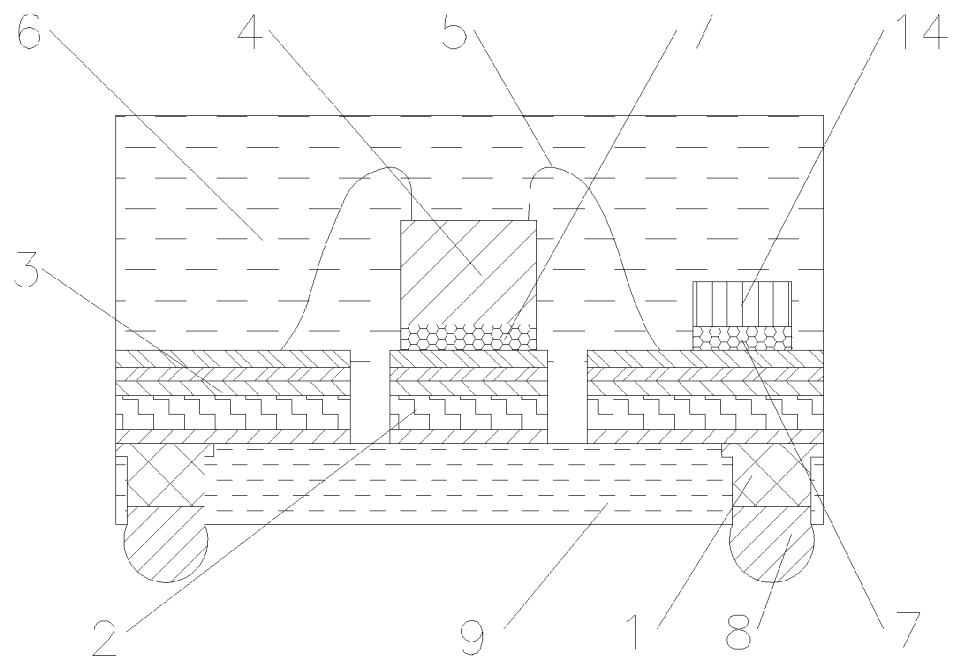
FIG. 20A is a cross-sectional view of another exemplary no-exposed-pad BGA packaging structure consistent with the disclosed embodiments.
Figure 20B:
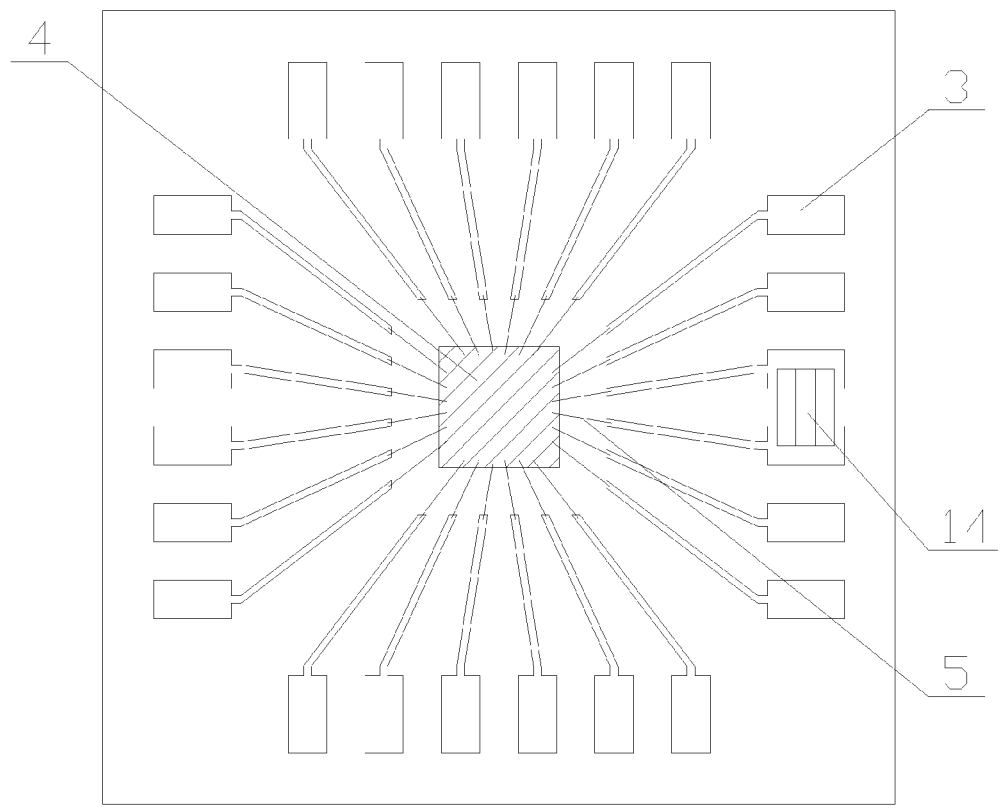
FIG. 20B is a top view of the exemplary no-exposed-pad BGA packaging structure of FIG. 20A.

FIG. 20A and FIG. 20B illustrate another exemplary no-exposed-pad BGA packaging structure. FIG. 20A is a cross-sectional view of FIG. 20B.

As shown in FIG. 20A and FIG. 20B, the no-exposed-pad BGA packaging structure in FIG. 20A and FIG. 20B is similar to the no-exposed-pad BGA packaging structure in FIG. 19A and FIG. 19B. However, the no-exposed-pad BGA packaging structure in FIG. 20A also includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad BGA packaging structure with an inner die pad and a single lead ring coupled with passive devices may be formed.

Figure 21A:
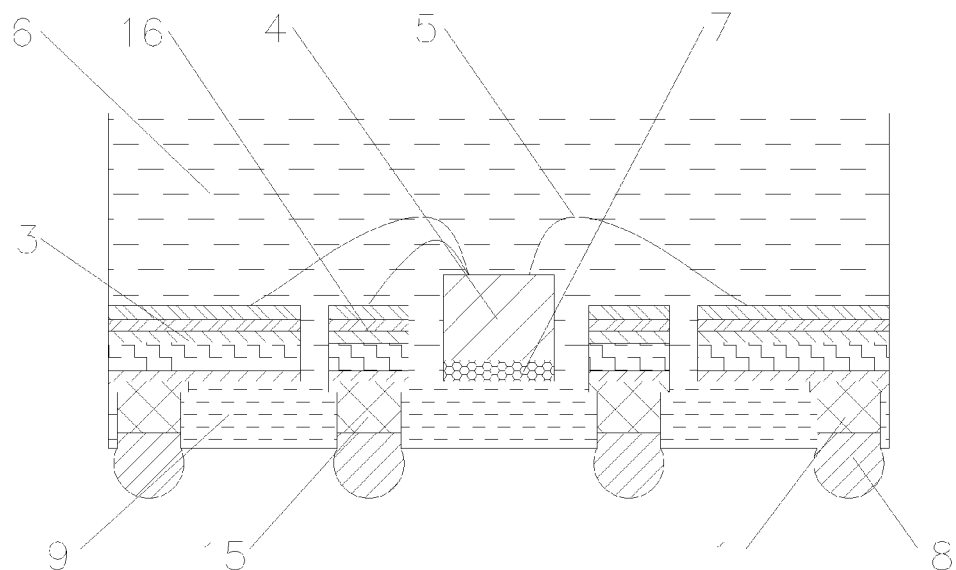
FIG. 21A is a cross-sectional view of another exemplary no-exposed-pad BGA packaging structure consistent with the disclosed embodiments.

FIG. 21A and FIG. 21 B illustrate another exemplary no-exposed-pad BGA packaging structure. FIG. 21 A is a cross-sectional view of FIG. 21 B.

Figure 21B:
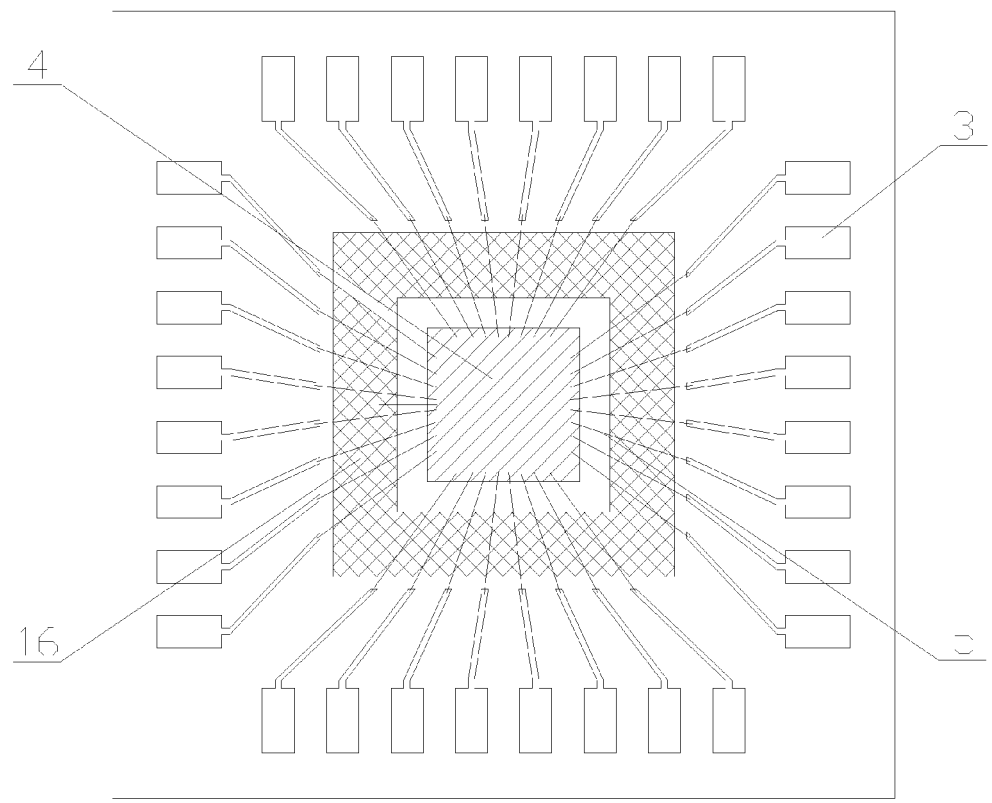
FIG. 21B is a top view of the exemplary no-exposed-pad BGA packaging structure of FIG. 21A.

As shown in FIG. 21 A and FIG. 21 B, the no-exposed-pad BGA packaging structure in FIG. 21A and FIG. 21B is similar to the no-exposed-pad BGA packaging structure in FIG. 17A and FIG. 17B. However, the no-exposed-pad BGA packaging structure in FIG. 21A and FIG. 21B also includes an outer electrostatic discharge ring 15, and an inner electrostatic discharge ring 16 may be formed on the top surface of the outer electrostatic discharge ring 15 within the outer lead ring. That is, the inner electrostatic discharge ring 16 may also be formed by the multi-layer plating process for forming the first metal layer 13. More particularly, the inner electrostatic discharge ring 16 may be arranged between the inner die pad 2 and inner leads 3. Further, the top surface of the die 4 is connected to the top surface of the inner electrostatic discharge ring 16 by the metal wire 5 such that the die 4 may be protected from stationary electric charges by the internal and outer electrostatic discharge rings 16 and 15. Both the outer electrostatic discharge ring 15 and the inner electrostatic discharge ring 16 may be in any appropriate shape, such as a rectangle ring, etc. Thus, a no-exposed-pad BGA packaging structure with an inner die pad, a single lead ring, and electrostatic discharge rings may be formed.

Figure 22A:
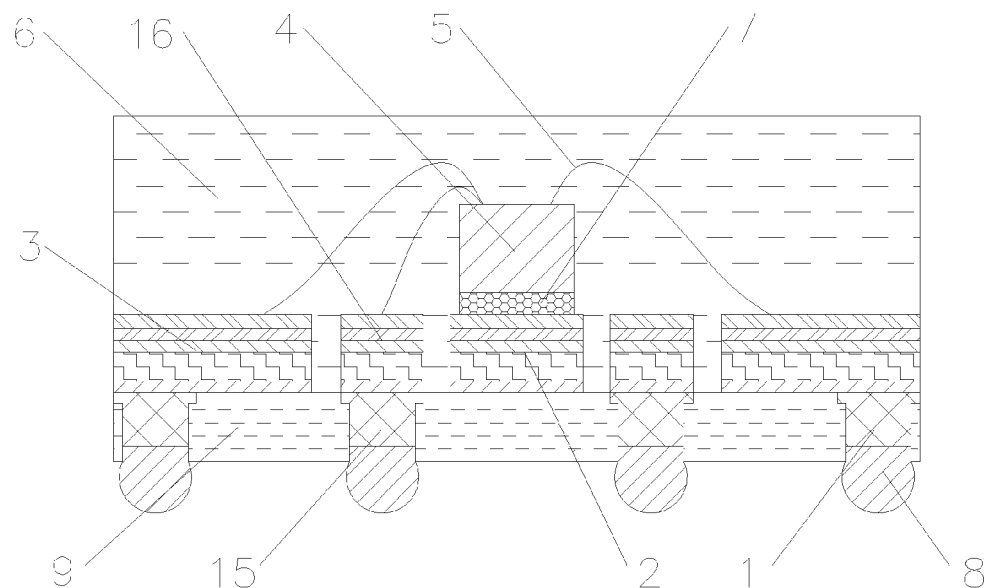
FIG. 22A is a cross-sectional view of another exemplary no-exposed-pad BGA packaging structure consistent with the disclosed embodiments.
Figure 22B:
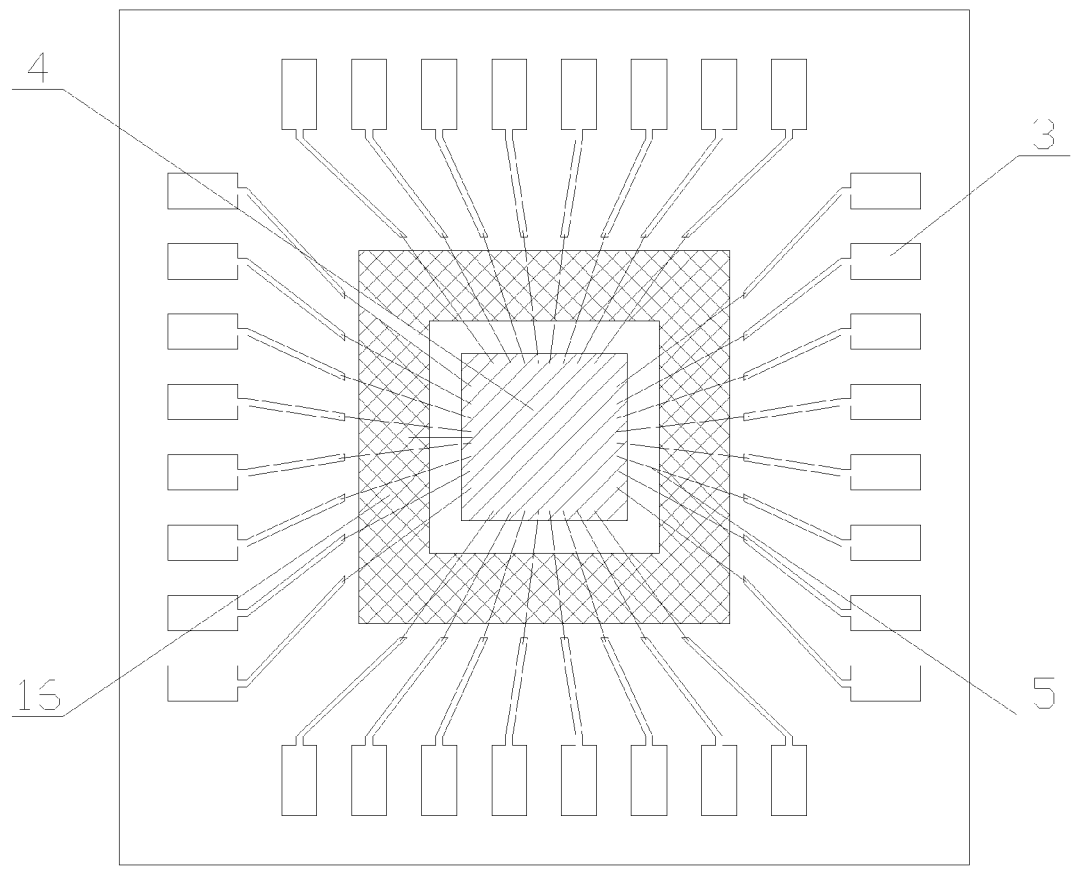
FIG. 22B is a top view of the exemplary no-exposed-pad BGA packaging structure of FIG. 22A.

FIG. 22A and FIG. 22B illustrate another exemplary no-exposed-pad BGA packaging structure. FIG. 22A is a cross-sectional view of FIG. 22B.

As shown in FIG. 22 A and FIG. 22 B, the no-exposed-pad BGA packaging structure in FIG. 22A and FIG. 22B is similar to the no-exposed-pad BGA packaging structure in FIG. 21A and FIG. 21B. However, the no-exposed-pad BGA packaging structure in FIG. 22A also includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad BGA packaging structure with an inner die pads, a single lead ring, and electrostatic discharge rings may be formed.

Figure 23A:
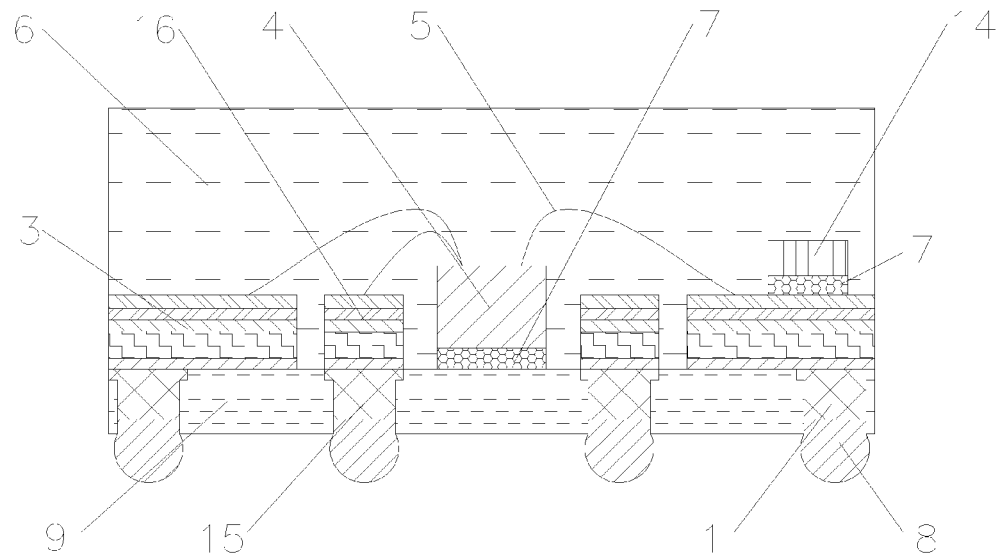
FIG. 23A is a cross-sectional view of another exemplary no-exposed-pad BGA packaging structure consistent with the disclosed embodiments.
Figure 23B:
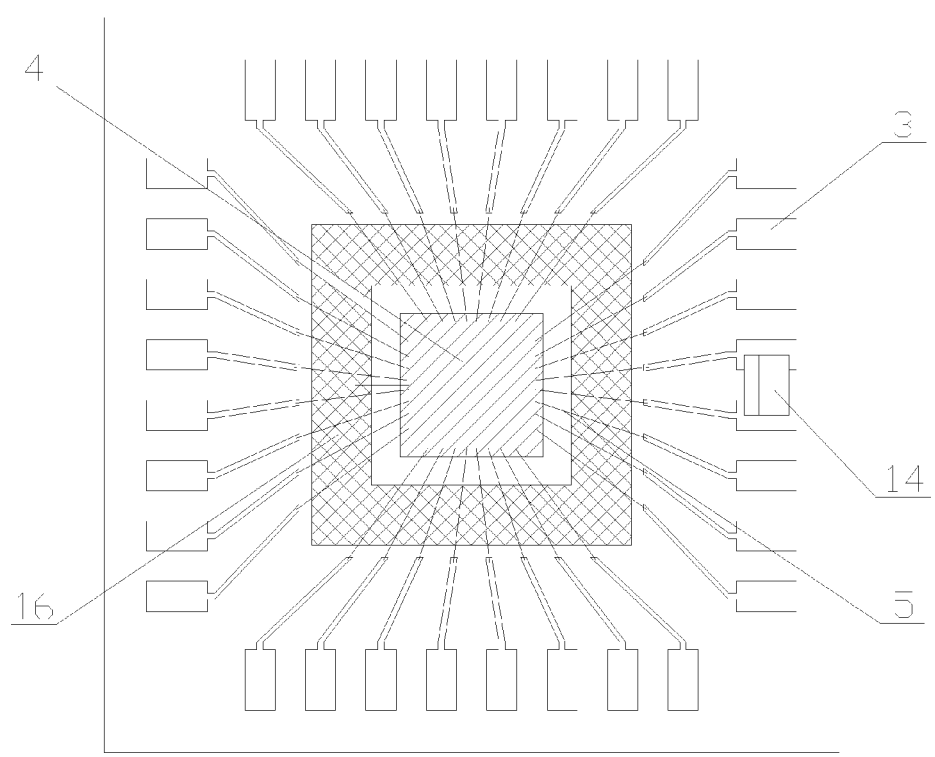
FIG. 23B is a top view of the exemplary no-exposed-pad BGA packaging structure of FIG. 23A.

FIG. 23A and FIG. 23B illustrate another exemplary no-exposed-pad BGA packaging structure. FIG. 23A is a cross-sectional view of FIG. 23B.

As shown in FIG. 23 A and FIG. 23 B, the no-exposed-pad BGA packaging structure in FIG. 23A and FIG. 23B is similar to the no-exposed-pad BGA packaging structure in FIG. 21A and FIG. 21B. However, the no-exposed-pad BGA packaging structure in FIG. 23A also includes one or more passive devices 14 coupled between the inner leads 3 by using the conductive or non-conductive adhesive material 7. Thus, a no-exposed-pad BGA packaging structure with a single lead ring coupled with passive devices and electrostatic discharge rings may be formed.

Figure 24A:
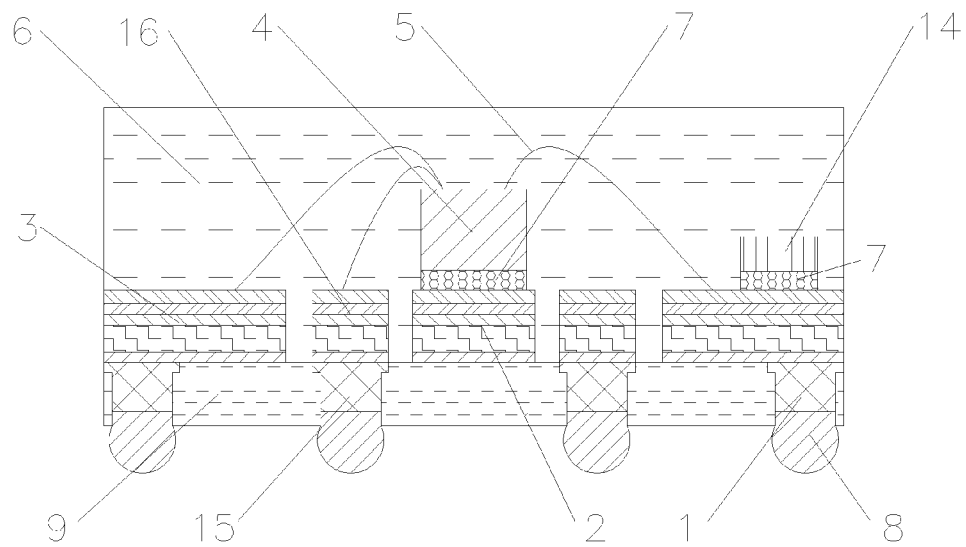
FIG. 24A is a cross-sectional view of another exemplary no-exposed-pad BGA packaging structure consistent with the disclosed embodiments.
Figure 24B:
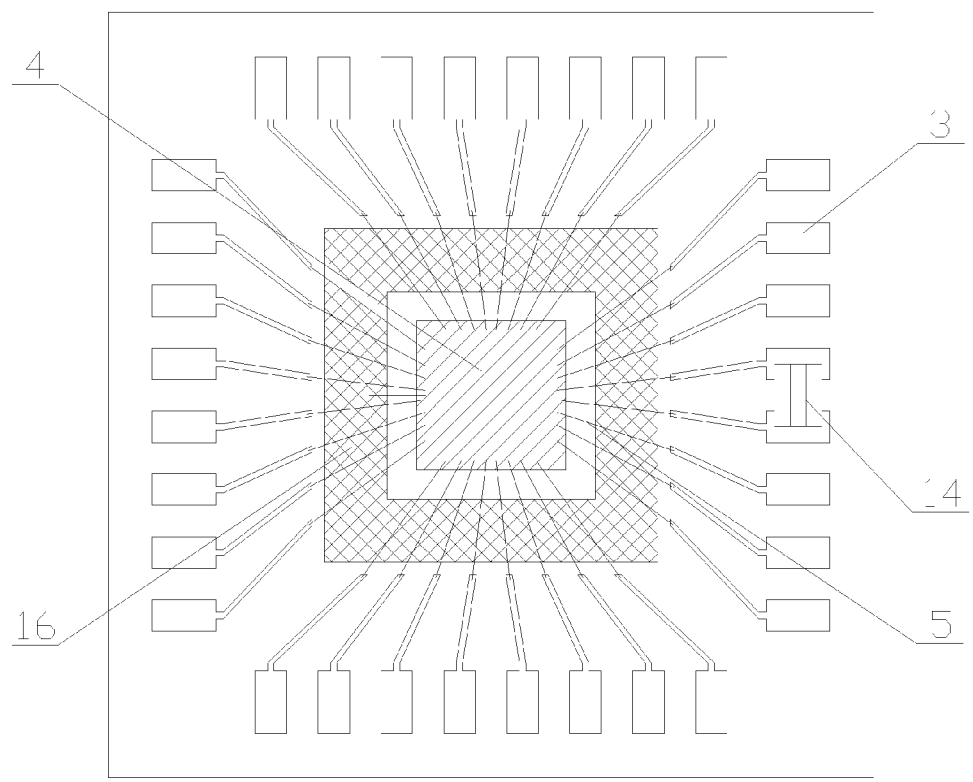
FIG. 24B is a top view of the exemplary no-exposed-pad BGA packaging structure of FIG. 24A.

FIG. 24A and FIG. 24B illustrate another exemplary no-exposed-pad BGA packaging structure. FIG. 24A is a cross-sectional view of FIG. 24B.

As shown in FIG. 24A and FIG. 24B, the no-exposed-pad BGA packaging structure in FIG. 24A and FIG. 24B is similar to the no-exposed-pad BGA packaging structure in FIG. 23A and FIG. 23B. However, the no-exposed-pad BGA packaging structure in FIG. 24A also includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad BGA packaging structure with an inner die pad, a single lead ring coupled with passive devices, and electrostatic discharge rings may be formed.

Figure 25A:
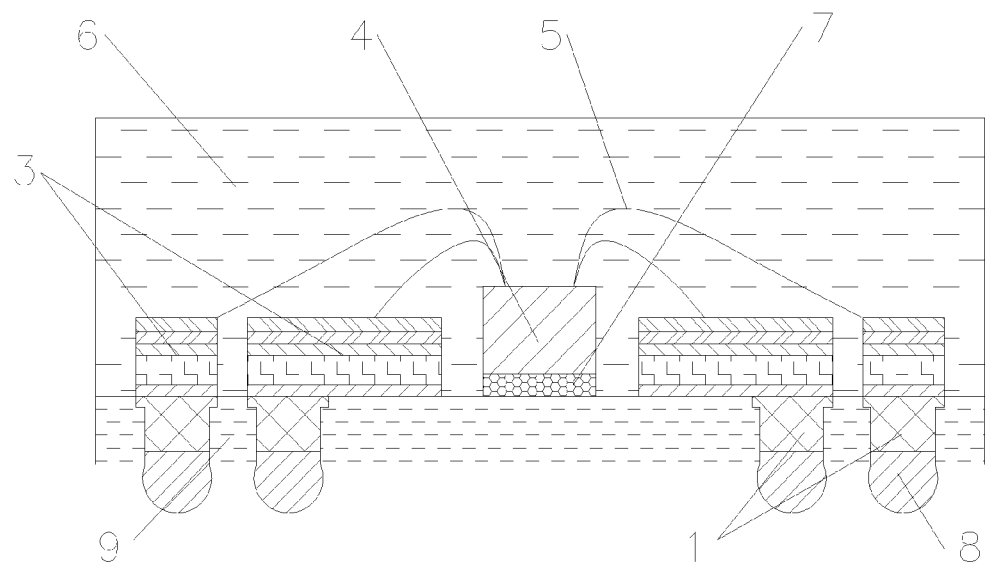
FIG. 25A is a cross-sectional view of another exemplary no-exposed-pad BGA packaging structure consistent with the disclosed embodiments.
Figure 25B:
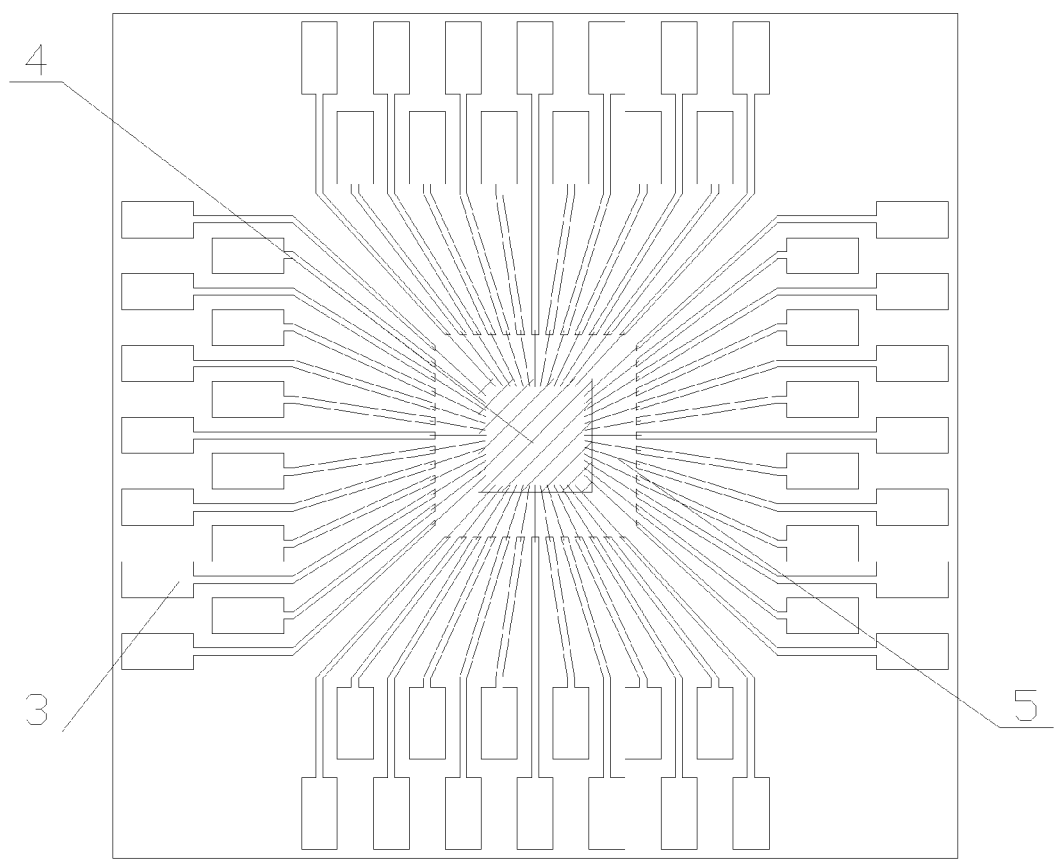
FIG. 25B is a top view of the exemplary no-exposed-pad BGA packaging structure of FIG. 25A.

FIG. 25A and FIG. 25B illustrate another exemplary no-exposed-pad BGA packaging structure. FIG. 25A is a cross-sectional view of FIG. 25B.

As shown in FIG. 25A and FIG. 25B, the no-exposed-pad BGA packaging structure in FIG. 25A and FIG. 25B is similar to the no-exposed-pad BGA packaging structure in FIG. 17A and FIG. 17B. However, the no-exposed-pad BGA packaging structure in FIGS. 25A and 25B includes multiple rings of outer leads 1. In other words, outer leads 1 are arranged in a multiple-ring configuration, and the leads in the multiple rings may be arranged in a staggered or zigzag way such that the leads and lead traces can be closely placed to the die 4. Further, multiple rings of inner leads 3 may be formed on the top surface of the outer leads 1. That is, the multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings may be significantly reduced. Thus, a no-exposed-pad BGA packaging structure with multiple lead rings may be formed.

Figure 26A:
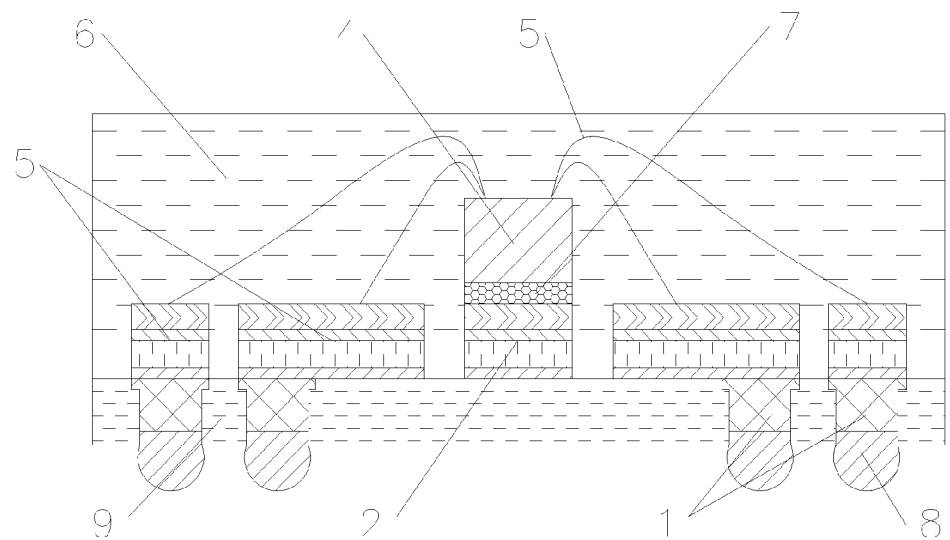
FIG. 26A is a cross-sectional view of another exemplary no-exposed-pad BGA packaging structure consistent with the disclosed embodiments.
Figure 26B:
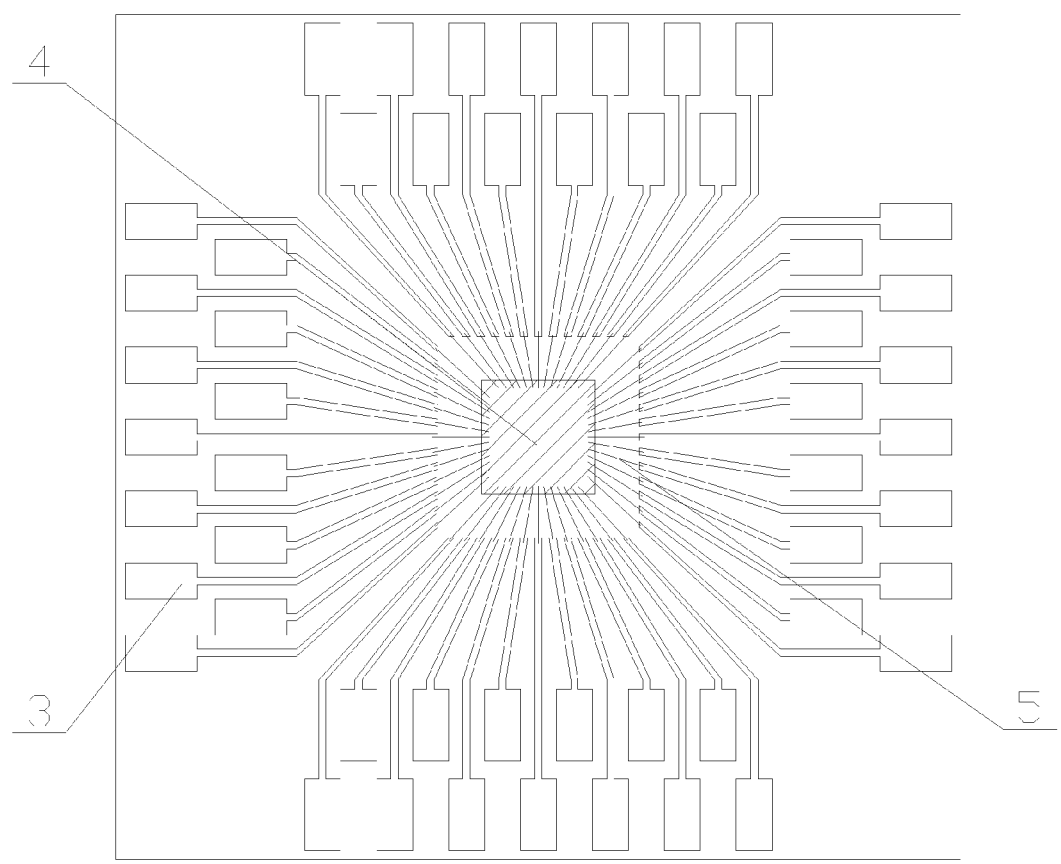
FIG. 26B is a top view of the exemplary no-exposed-pad BGA packaging structure of FIG. 26A.

FIG. 26A and FIG. 26B illustrate another exemplary no-exposed-pad BGA packaging structure. FIG. 26A is a cross-sectional view of FIG. 26B.

As shown in FIG. 26A and FIG. 26B, the no-exposed-pad BGA packaging structure in FIG. 26A and FIG. 26B is similar to the no-exposed-pad BGA packaging structure in FIG. 25A and FIG. 25B. However, the no-exposed-pad BGA packaging structure in FIGS. 26A and 26B includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad BGA packaging structure with an inner die pad and multiple lead rings may be formed.

Figure 27A:
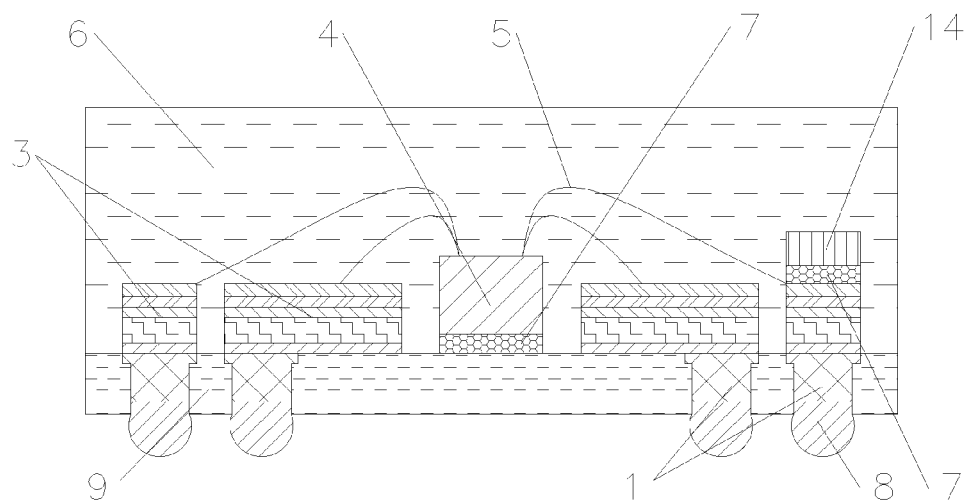
FIG. 27A is a cross-sectional view of another exemplary no-exposed-pad BGA packaging structure consistent with the disclosed embodiments.
Figure 27B:
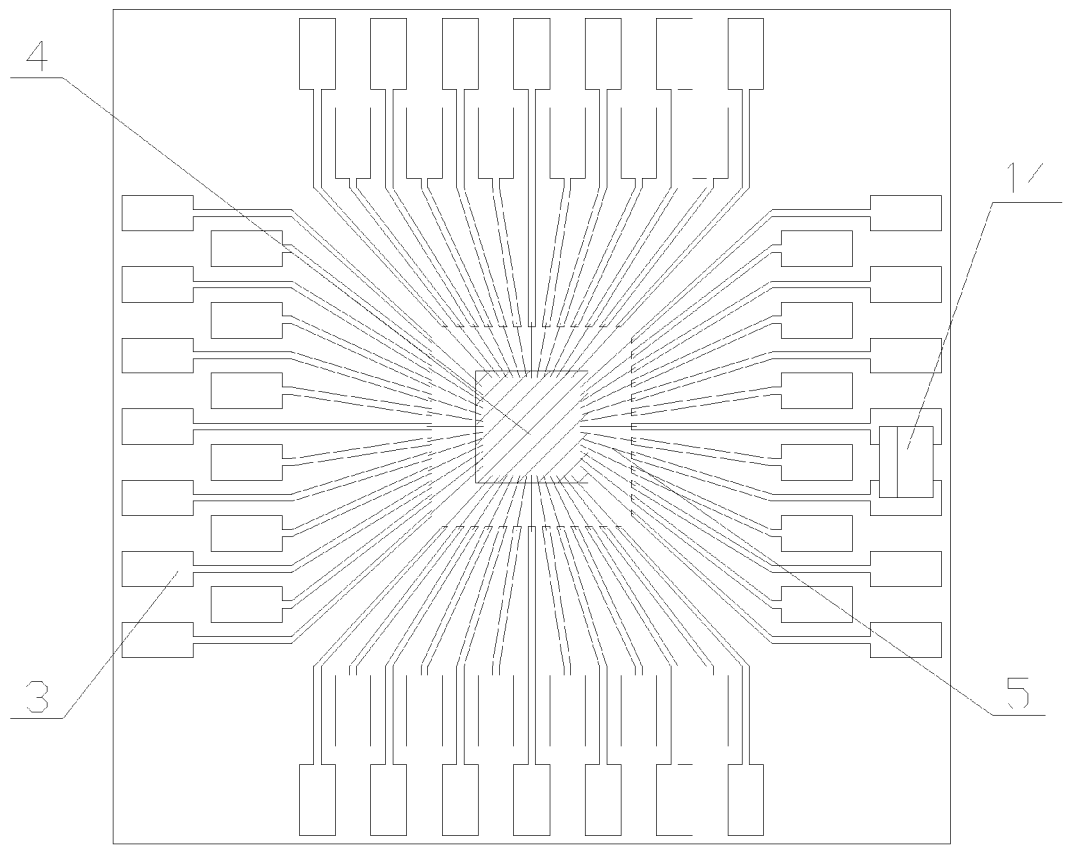
FIG. 27B is a top view of the exemplary no-exposed-pad BGA packaging structure of FIG. 27A.

FIG. 27A and FIG. 27B illustrate another exemplary no-exposed-pad BGA packaging structure. FIG. 27A is a cross-sectional view of FIG. 27B.

As shown in FIG. 27A and FIG. 27B, the no-exposed-pad BGA packaging structure in FIG. 27A and FIG. 27B is similar to the no-exposed-pad BGA packaging structure in FIG. 25A and FIG. 25B. However, the no-exposed-pad BGA packaging structure in FIGS. 27A and 27B includes one or more passive devices 14 coupled between the inner leads 3 using the conductive or non-conductive adhesive material 7. Thus, a no-exposed-pad BGA packaging structure with multiple lead rings coupled with passive devices may be formed.

Figure 28A:
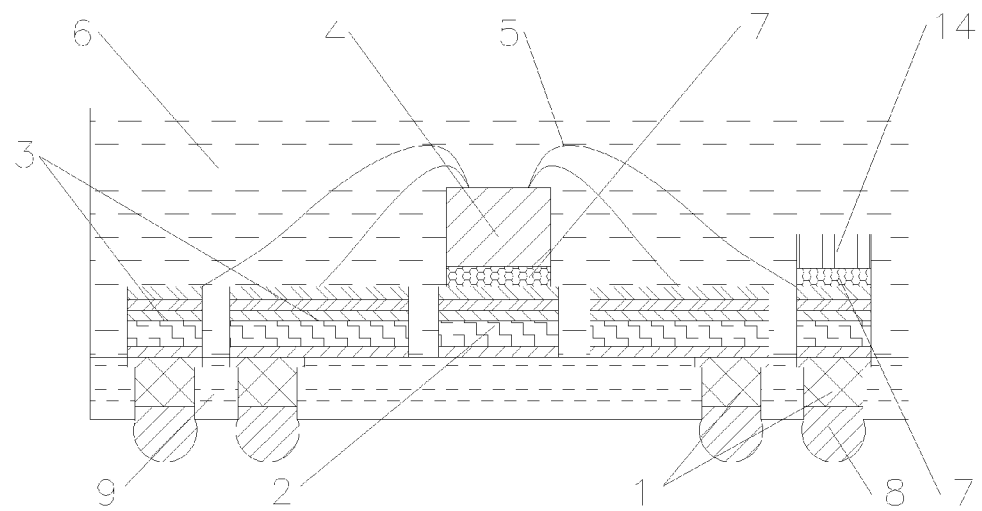
FIG. 28A is a cross-sectional view of another exemplary no-exposed-pad BGA packaging structure consistent with the disclosed embodiments.
Figure 28B:
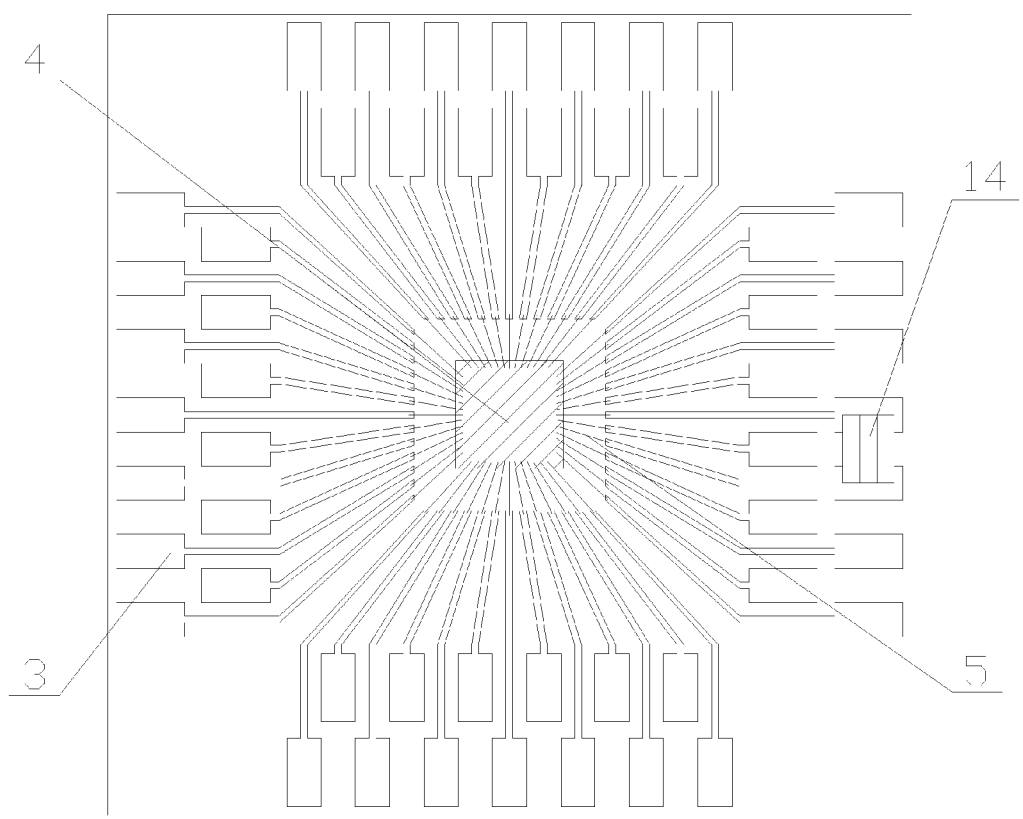
FIG. 28B is a top view of the exemplary no-exposed-pad BGA packaging structure of FIG. 28A.

FIG. 28A and FIG. 28B illustrate another exemplary no-exposed-pad BGA packaging structure. FIG. 28A is a cross-sectional view of FIG. 28B.

As shown in FIG. 28A and FIG. 28B, the no-exposed-pad BGA packaging structure in FIG. 28A and FIG. 28B is similar to the no-exposed-pad BGA packaging structure in FIG. 27A and FIG. 27B. However, the no-exposed-pad BGA packaging structure in FIGS. 28A and 28B includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad BGA packaging structure with an inner die pad and multiple lead rings coupled with passive devices may be formed.

Figure 29A:
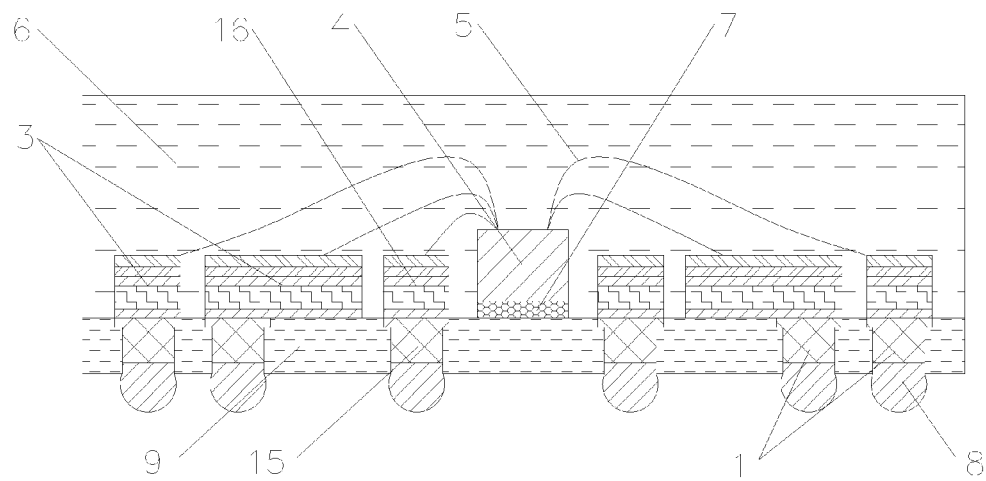
FIG. 29A is a cross-sectional view of another exemplary no-exposed-pad BGA packaging structure consistent with the disclosed embodiments.
Figure 29B:
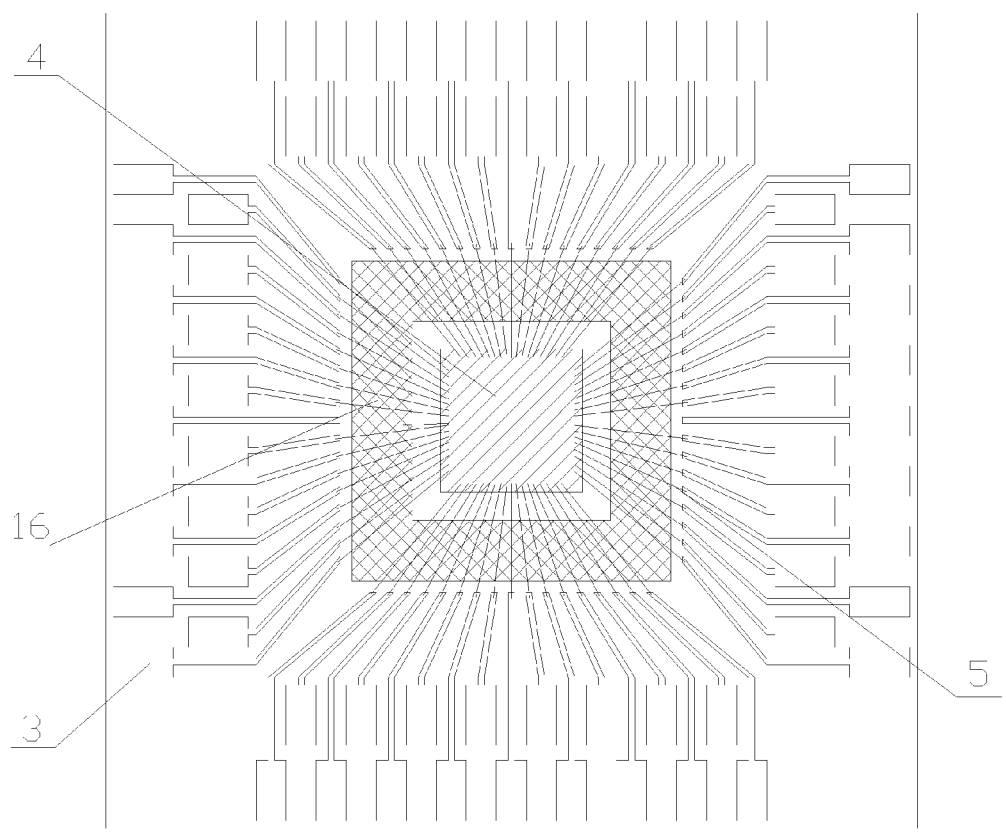
FIG. 29B is a top view of the exemplary no-exposed-pad BGA packaging structure of FIG. 29A.

FIG. 29A and FIG. 29B illustrate another exemplary no-exposed-pad BGA packaging structure. FIG. 29A is a cross-sectional view of FIG. 29B.

As shown in FIG. 29A and FIG. 29B, the no-exposed-pad BGA packaging structure in FIG. 29A and FIG. 29B is similar to the no-exposed-pad BGA packaging structure in FIG. 25A and FIG. 25B. However, the no-exposed-pad BGA packaging structure in FIGS. 29A and 29B includes an outer electrostatic discharge ring 15, and an inner electrostatic discharge ring 16 may be formed on the top surface of the outer electrostatic discharge ring 15 within the outer lead ring. That is, the inner electrostatic discharge ring 16 may also be formed by the multi-layer plating process for forming the first metal layer 13. More particularly, the inner electrostatic discharge ring 16 may be arranged between the inner die pad 2 and the inner leads 3. Further, the top surface of the die 4 is connected to the top surface of the inner electrostatic discharge ring 16 by the metal wire 5 such that the die 4 may be protected from stationary electric charges by the internal and outer electrostatic discharge rings 16 and 15. Solder balls 8 may also be formed on the back surface of the outer electrostatic discharge ring 15. Thus, a no-exposed-pad BGA packaging structure with multiple lead rings and electrostatic discharge rings may be formed.

Figure 30A:
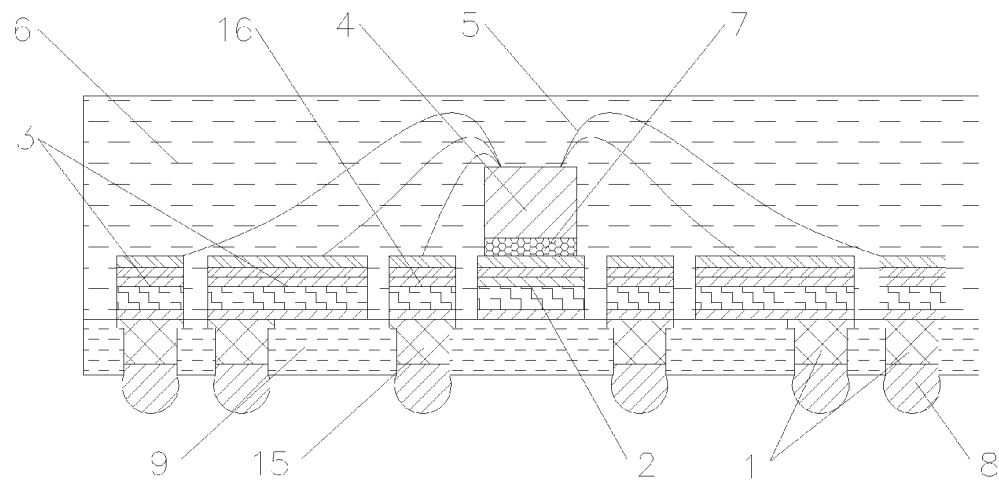
FIG. 30A is a cross-sectional view of another exemplary no-exposed-pad BGA packaging structure consistent with the disclosed embodiments.
Figure 30B:
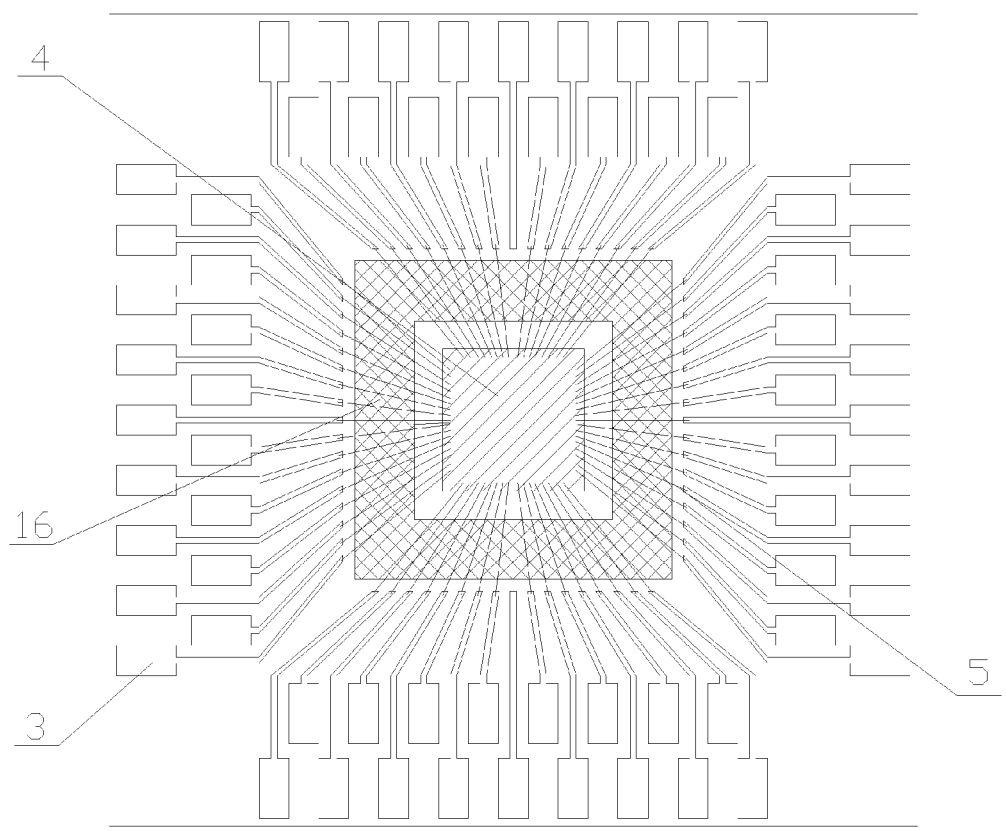
FIG. 30B is a top view of the exemplary no-exposed-pad BGA packaging structure of FIG. 30A.

FIG. 30A and FIG. 30B illustrate another exemplary no-exposed-pad BGA packaging structure. FIG. 30A is a cross-sectional view of FIG. 30B.

As shown in FIG. 30A and FIG. 30B, the no-exposed-pad BGA packaging structure in FIG. 30A and FIG. 30B is similar to the no-exposed-pad BGA packaging structure in FIG. 29A and FIG. 29B. However, the no-exposed-pad BGA packaging structure in FIGS. 30A and 30B includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad BGA packaging structure with inner die pad, multiple lead rings, and electrostatic discharge rings may be formed.

Figure 31A:
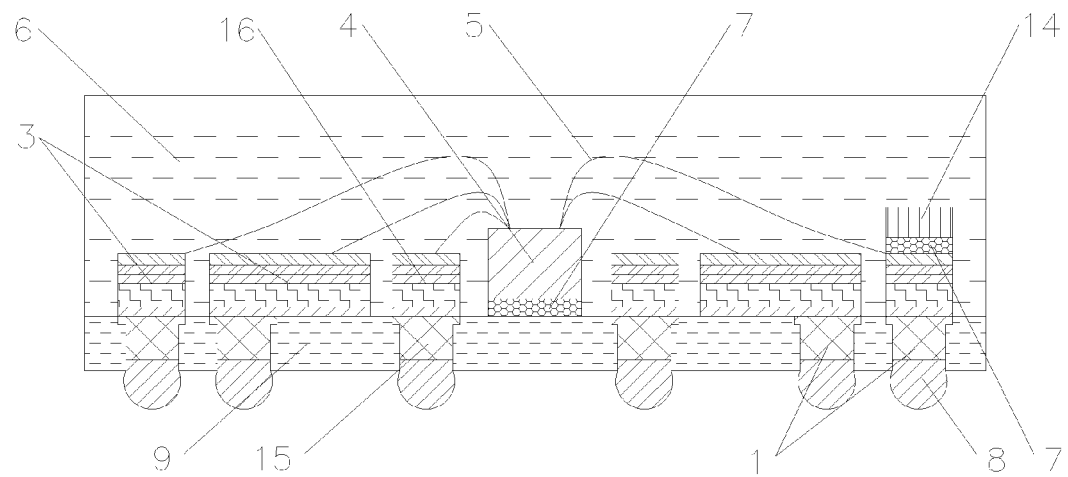
FIG. 31A is a cross-sectional view of another exemplary no-exposed-pad BGA packaging structure consistent with the disclosed embodiments.
Figure 31B:
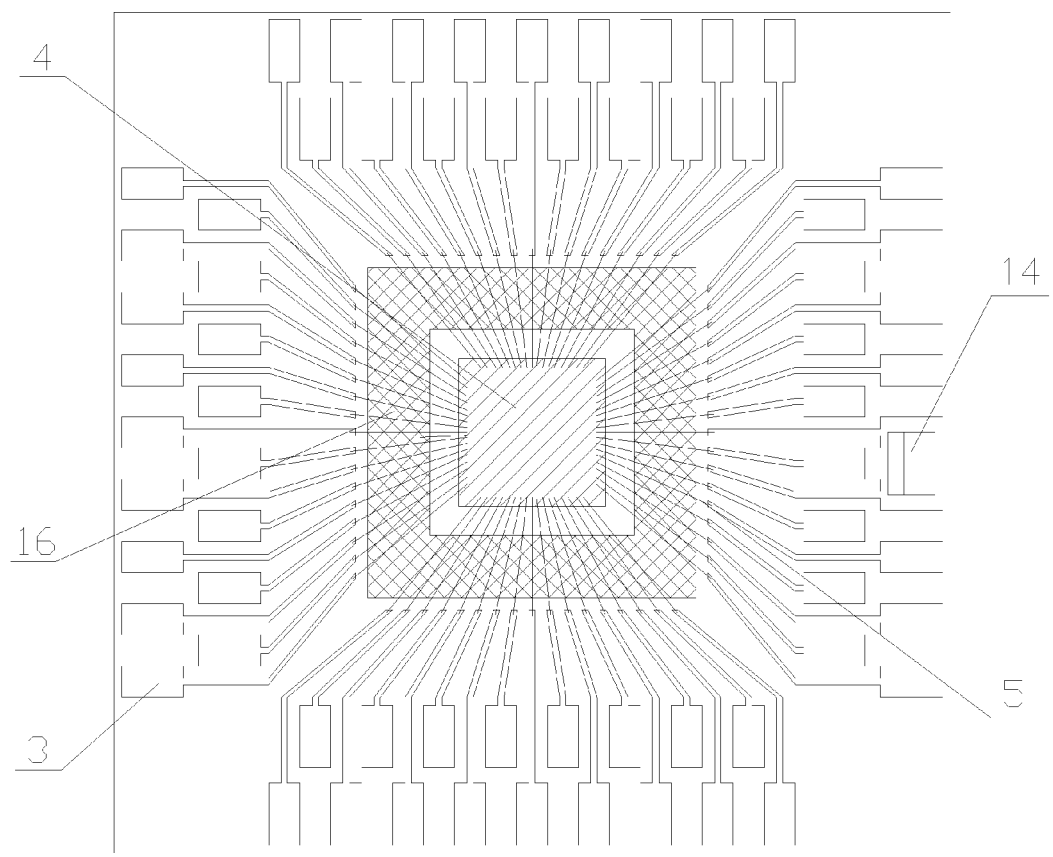
FIG. 31B is a top view of the exemplary no-exposed-pad BGA packaging structure of FIG. 31A.

FIG. 31A and FIG. 31B illustrate another exemplary no-exposed-pad BGA packaging structure. FIG. 31A is a cross-sectional view of FIG. 31B.

As shown in FIG. 31A and FIG. 31B, the no-exposed-pad BGA packaging structure in FIG. 31A and FIG. 31B is similar to the no-exposed-pad BGA packaging structure in FIG. 29A and FIG. 29B. However, the no-exposed-pad BGA packaging structure in FIGS. 31A and 31B includes one or more passive devices 14 coupled between the inner leads 3 using conductive or non-conductive adhesive material 7. Thus, a no-exposed-pad BGA packaging structure with multiple lead rings coupled with passive devices, and electrostatic discharge rings may be formed.

Figure 32A:
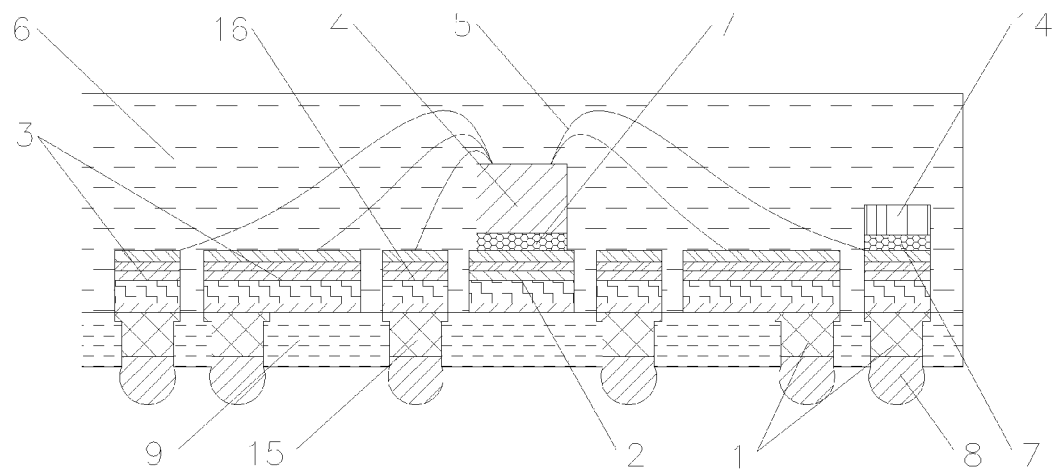
FIG. 32A is a cross-sectional view of another exemplary no-exposed-pad BGA packaging structure consistent with the disclosed embodiments.
Figure 32B:
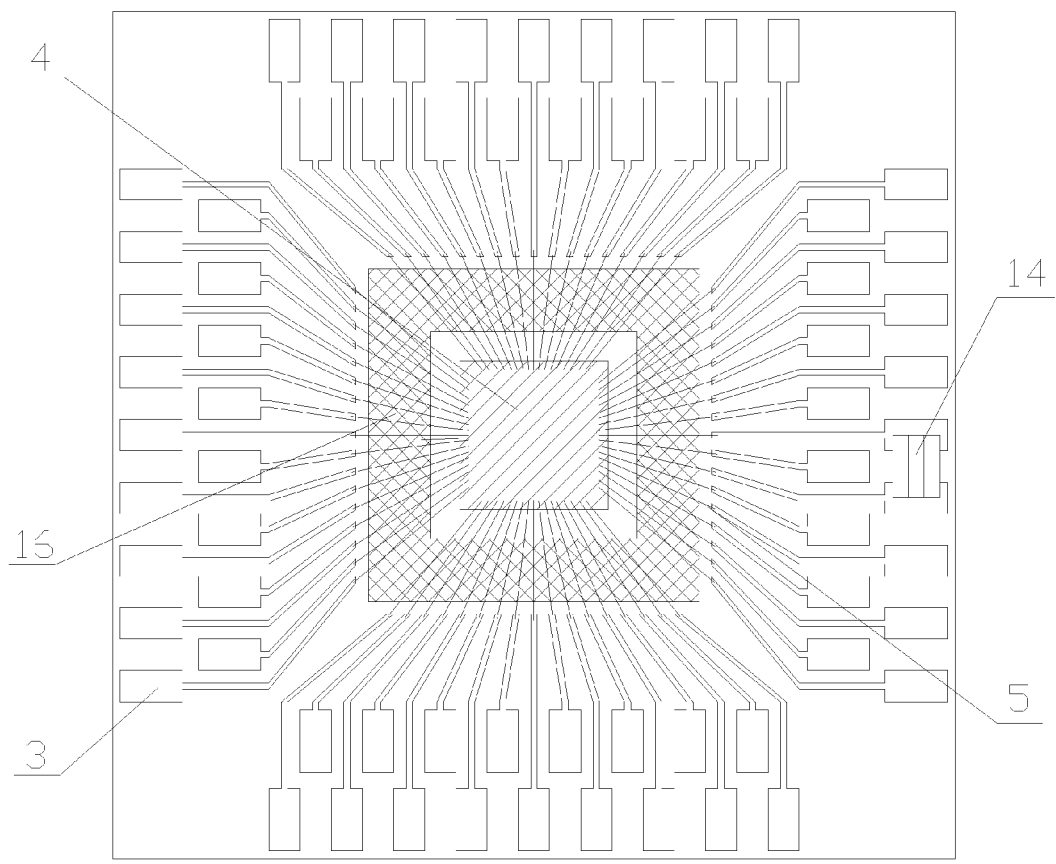
FIG. 32B is a top view of the exemplary no-exposed-pad BGA packaging structure of FIG. 32A.

FIG. 32A and FIG. 32B illustrate another exemplary no-exposed-pad BGA packaging structure. FIG. 32A is a cross-sectional view of FIG. 32B.

As shown in FIG. 32A and FIG. 32B, the no-exposed-pad BGA packaging structure in FIG. 32A and FIG. 32B is similar to the no-exposed-pad BGA packaging structure in FIG. 31A and FIG. 31B. However, the no-exposed-pad BGA packaging structure in FIGS. 32A and 32B includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad BGA packaging structure with inner die pad, multiple lead rings coupled with passive devices, and electrostatic discharge rings may be formed.

Figure 33A:
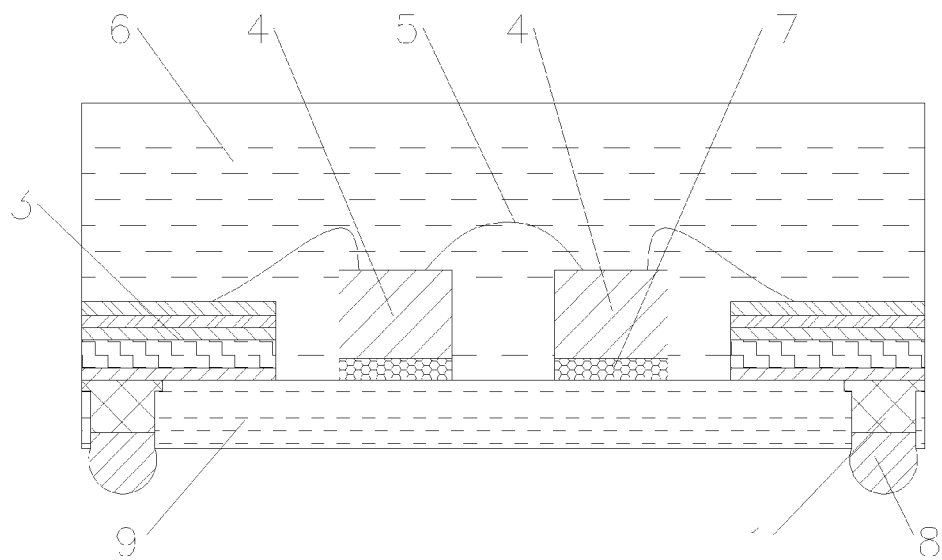
FIG. 33A is a cross-sectional view of another exemplary no-exposed-pad BGA packaging structure consistent with the disclosed embodiments.
Figure 33B:
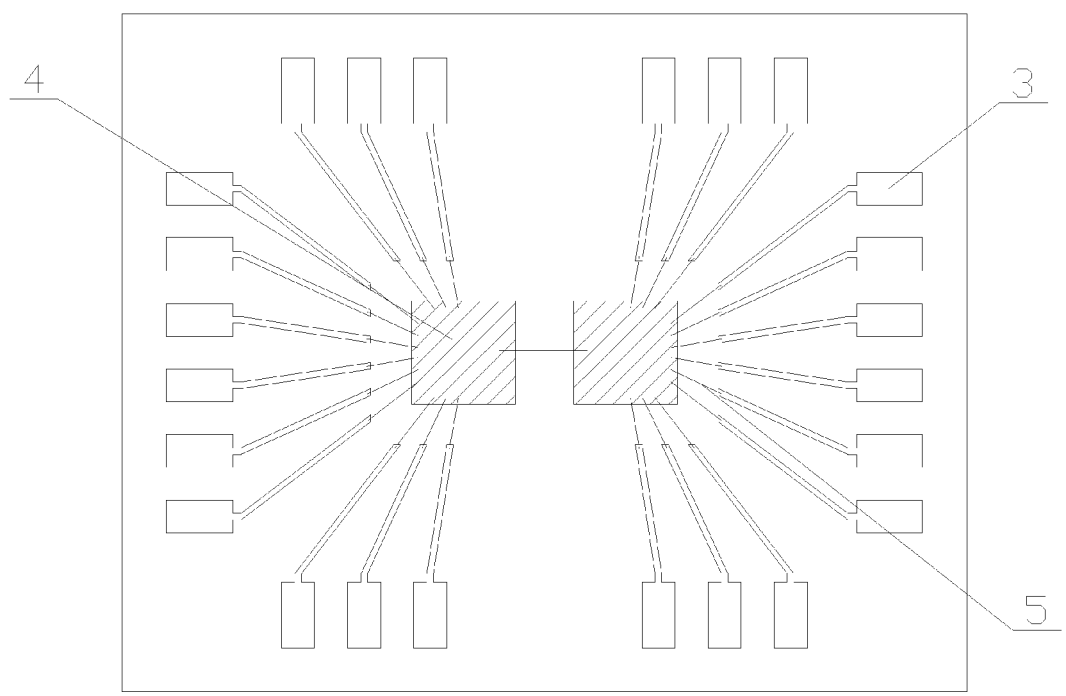
FIG. 33B is a top view of the exemplary no-exposed-pad BGA packaging structure of FIG. 33A.

FIG. 33A and FIG. 33B illustrate another exemplary no-exposed-pad BGA packaging structure. FIG. 33A is a cross-sectional view of FIG. 33B.

As shown in FIG. 33A and FIG. 33B, the no-exposed-pad BGA packaging structure in FIG. 33A and FIG. 33B is similar to the no-exposed-pad BGA packaging structure in FIG. 17A and FIG. 17B. However, the no-exposed-pad BGA packaging structure in FIGS. 33A and 33B includes a plurality of dies 4. Each of the plurality of dies 4 is attached on predetermined areas on the substrate or other planar supporting structure or within the ring or rings of inner leads 3 by conductive or non-conductive adhesive material 7. For example, a second die 4 is arranged in a side-by-side configuration with respect to the first die 4, and both dies 4 are arranged within the ring or rings of inner leads 3. Further, the top surface of each die 4 may be connected by metal wires 5. Thus, a no-exposed-pad BGA packaging structure with multiple dies and single a lead ring may be formed.

Figure 34A:
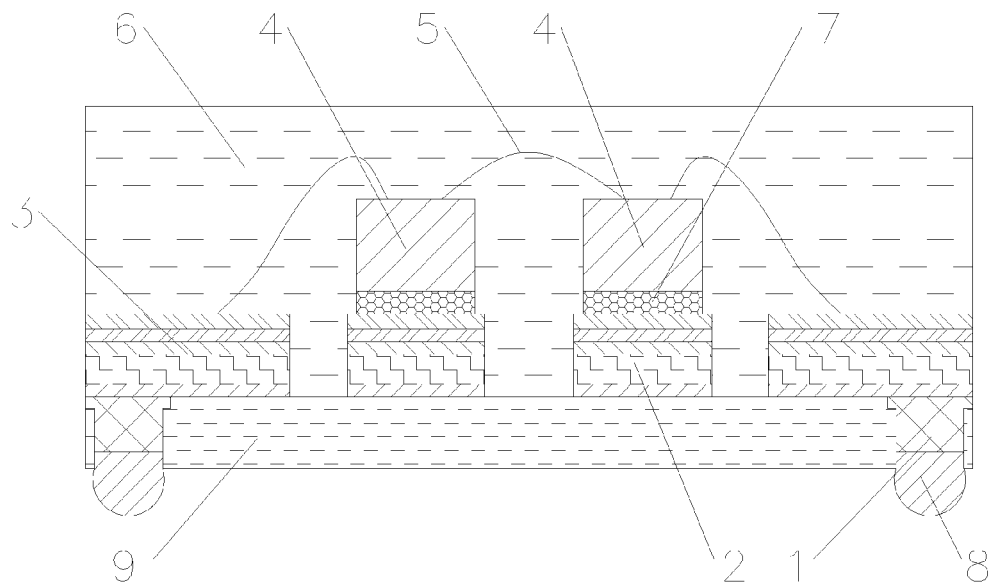
FIG. 34A is a cross-sectional view of another exemplary no-exposed-pad BGA packaging structure consistent with the disclosed embodiments.
Figure 34B:
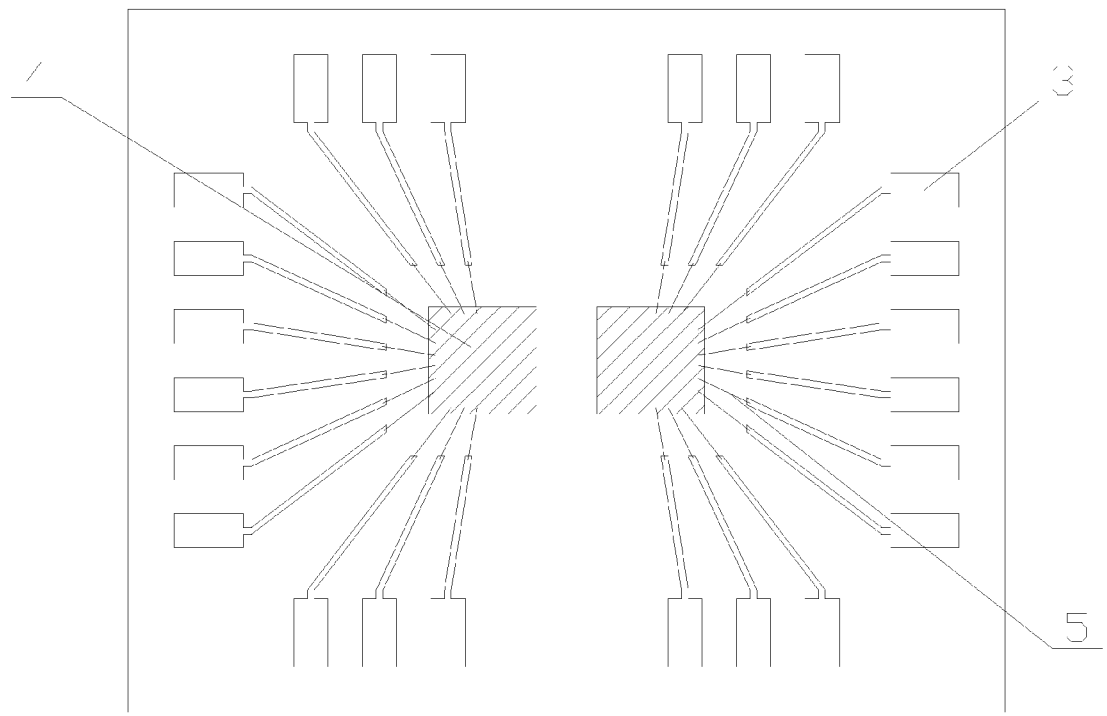
FIG. 34B is a top view of the exemplary no-exposed-pad BGA packaging structure of FIG. 34A.

FIG. 34A and FIG. 34B illustrate another exemplary no-exposed-pad BGA packaging structure. FIG. 34A is a cross-sectional view of FIG. 34B.

As shown in FIG. 34A and FIG. 34B, the no-exposed-pad BGA packaging structure in FIG. 34A and FIG. 34B is similar to the no-exposed-pad BGA packaging structure in FIG. 33A and FIG. 33B. However, the no-exposed-pad BGA packaging structure in FIGS. 34A and 34B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad BGA packaging structure with multiple dies, multiple inner die pads, and a single lead ring may be formed.

Figure 35A:
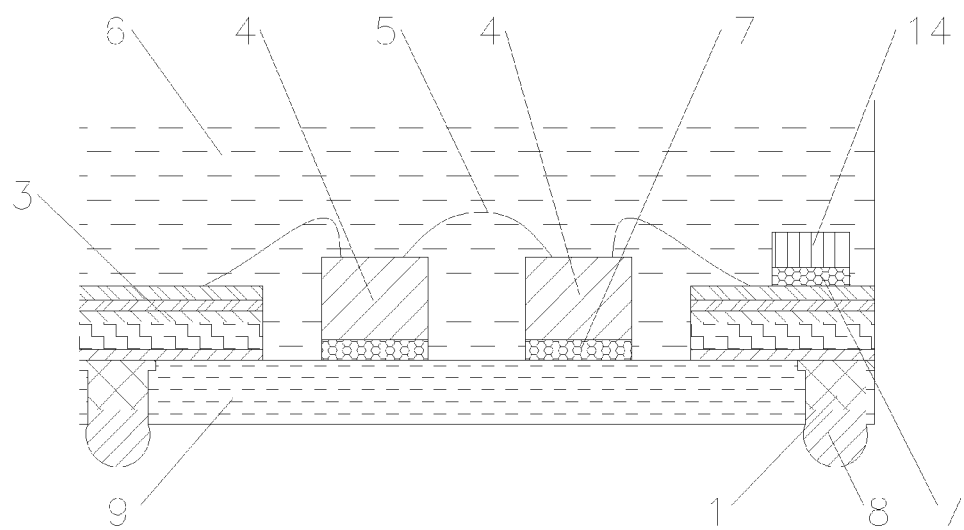
FIG. 35A is a cross-sectional view of another exemplary no-exposed-pad BGA packaging structure consistent with the disclosed embodiments.
Figure 35B:
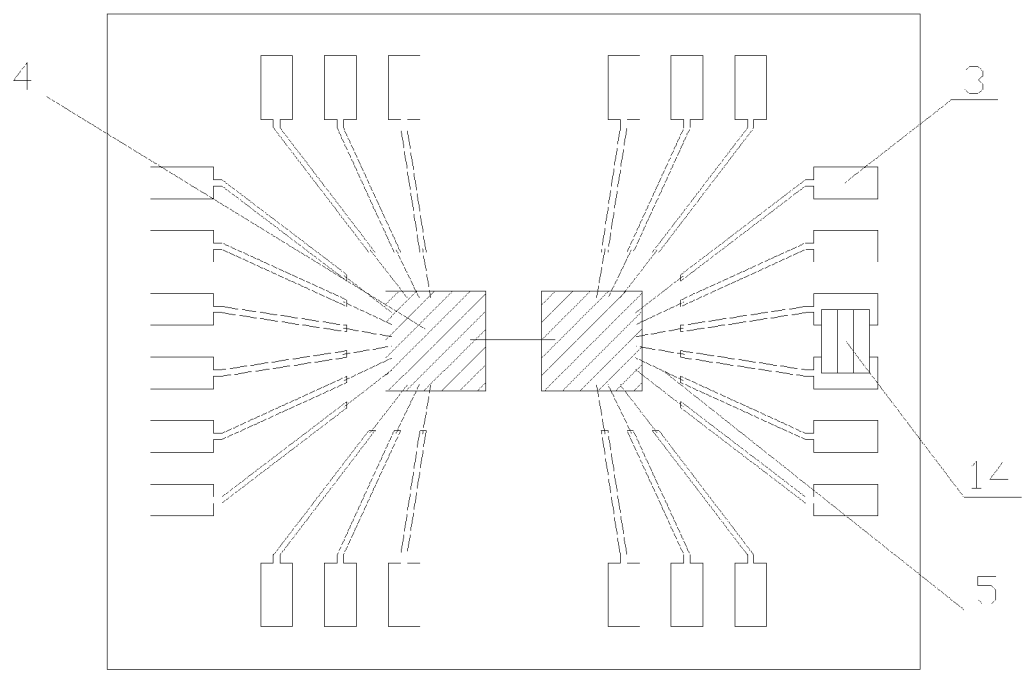
FIG. 35B is a top view of the exemplary no-exposed-pad BGA packaging structure of FIG. 35A.

FIG. 35A and FIG. 35B illustrate another exemplary no-exposed-pad BGA packaging structure. FIG. 35A is a cross-sectional view of FIG. 35B.

As shown in FIG. 35A and FIG. 35B, the no-exposed-pad BGA packaging structure in FIG. 35A and FIG. 35B is similar to the no-exposed-pad BGA packaging structure in FIG. 19A and FIG. 19B. However, the no-exposed-pad BGA packaging structure in FIGS. 35A and 35B includes a plurality of dies 4. Each of the plurality of dies 4 is attached on predetermined areas on the substrate or other planar supporting structure or within the ring or rings of inner leads 3 by the conductive or non-conductive adhesive material 7. For example, a second die 4 is arranged in a side-by-side configuration with respect to the first die 4, and both dies 4 are arranged within the ring or rings of inner leads 3. Further, the top surface of each die 4 may be connected by metal wires 5. Other configurations may also be used. Thus, a no-exposed-pad BGA packaging structure with multiple dies and a single lead ring coupled with passive devices may be formed.

Figure 36A:
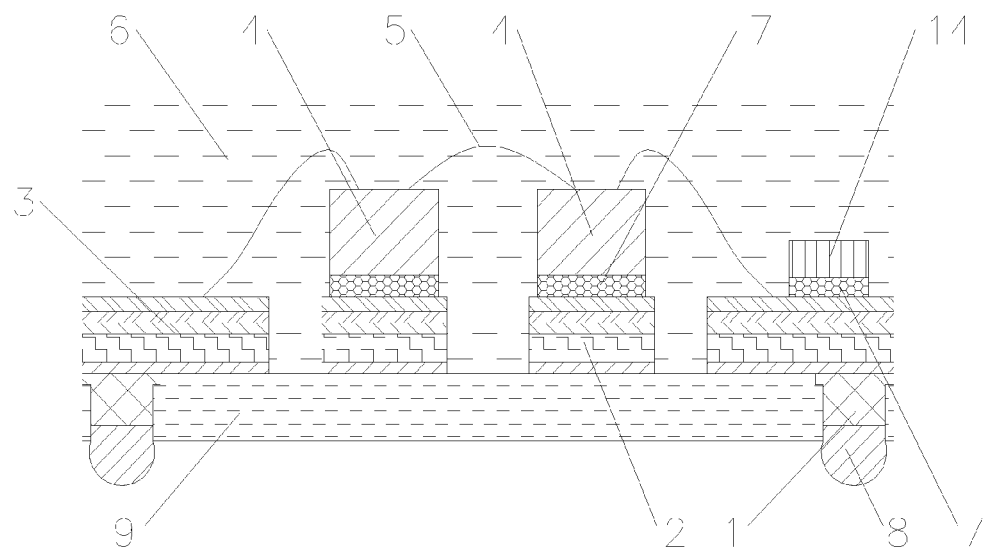
FIG. 36A is a cross-sectional view of another exemplary no-exposed-pad BGA packaging structure consistent with the disclosed embodiments.
Figure 36B:
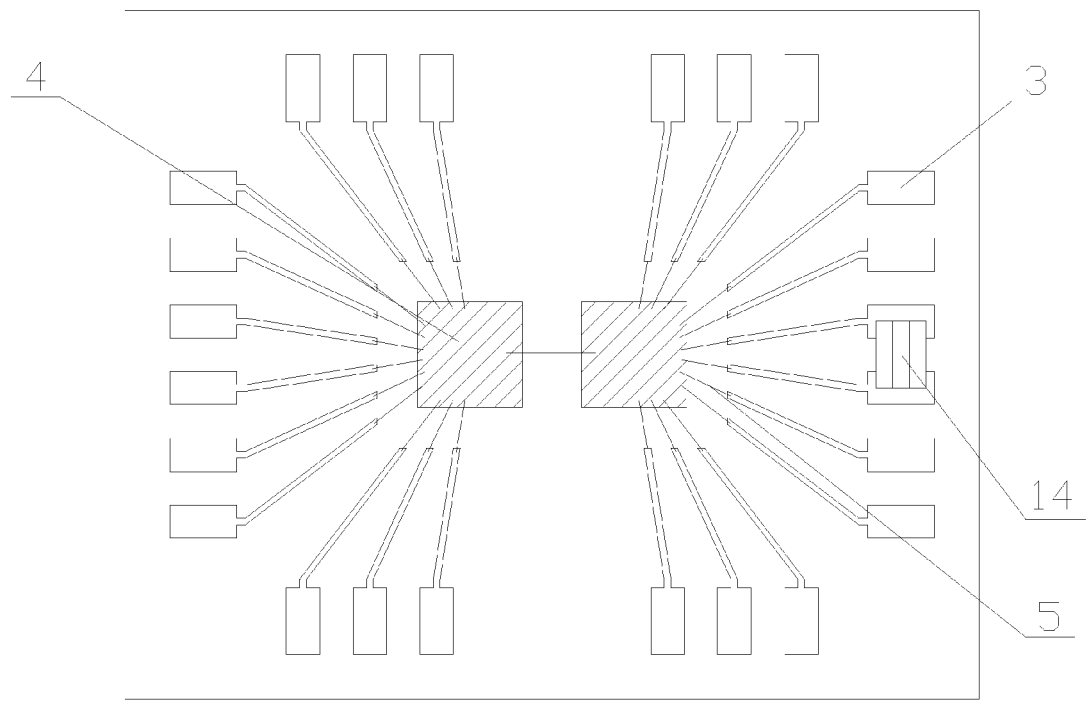
FIG. 36B is a top view of the exemplary no-exposed-pad BGA packaging structure of FIG. 36A.

FIG. 36A and FIG. 36B illustrate another exemplary no-exposed-pad BGA packaging structure. FIG. 36A is a cross-sectional view of FIG. 36B.

As shown in FIG. 36A and FIG. 36B, the no-exposed-pad BGA packaging structure in FIG. 36A and FIG. 36B is similar to the no-exposed-pad BGA packaging structure in FIG. 35A and FIG. 35B. However, the no-exposed-pad BGA packaging structure in FIGS. 36A and 36B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad BGA packaging structure with multiple dies, multiple inner die pads, and a single lead ring coupled with passive devices may be formed.

Figure 37A:
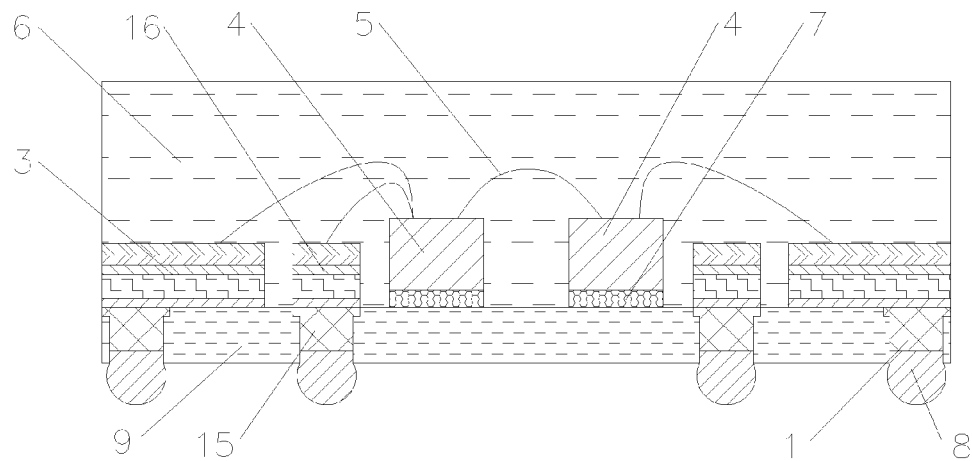
FIG. 37A is a cross-sectional view of another exemplary no-exposed-pad BGA packaging structure consistent with the disclosed embodiments.
Figure 37B:
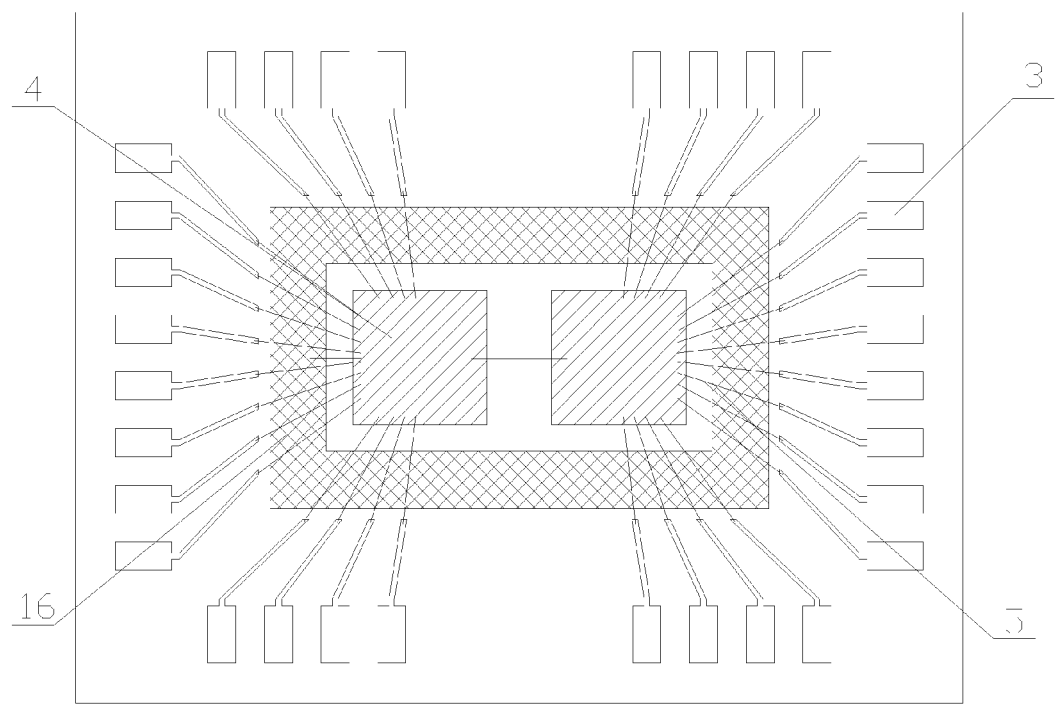
FIG. 37B is a top view of the exemplary no-exposed-pad BGA packaging structure of FIG. 37A.

FIG. 37A and FIG. 37B illustrate another exemplary no-exposed-pad BGA packaging structure. FIG. 37A is a cross-sectional view of FIG. 37B.

As shown in FIG. 37A and FIG. 37B, the no-exposed-pad BGA packaging structure in FIG. 37A and FIG. 37B is similar to the no-exposed-pad BGA packaging structure in FIG. 21A and FIG. 21B. However, the no-exposed-pad BGA packaging structure in FIGS. 37A and 37B includes a plurality of dies 4. Each of the plurality of dies 4 is attached on predetermined areas on the substrate or other planar supporting structure or within the ring or rings of inner leads 3 by conductive or non-conductive adhesive material 7. For example, a second die 4 is arranged in a side-by-side configuration with respect to the first die 4, and both dies 4 are arranged within the ring or rings of inner leads 3. Further, the top surface of each die 4 may be connected by metal wires 5. Other configurations may also be used. Thus, a no-exposed-pad BGA packaging structure with multiple dies, a single lead ring, and electrostatic discharge rings may be formed.

Figure 38A:
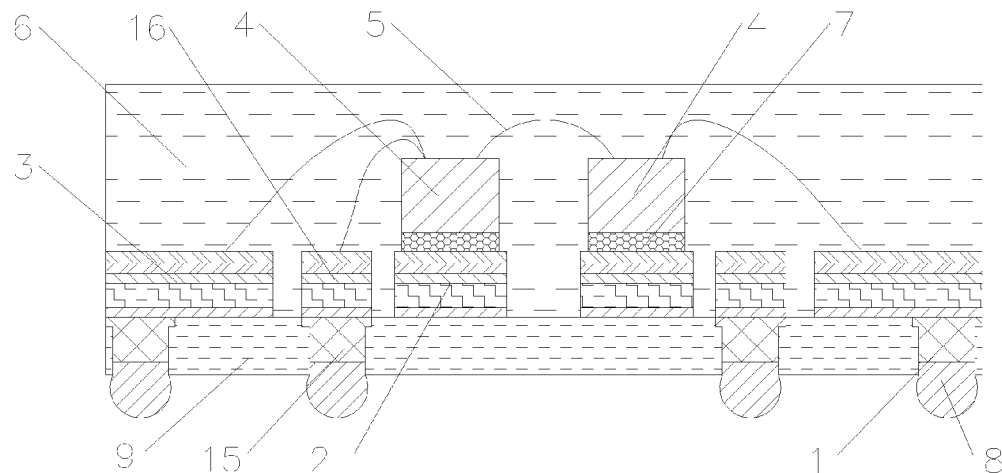
FIG. 38A is a cross-sectional view of another exemplary no-exposed-pad BGA packaging structure consistent with the disclosed embodiments.
Figure 38B:
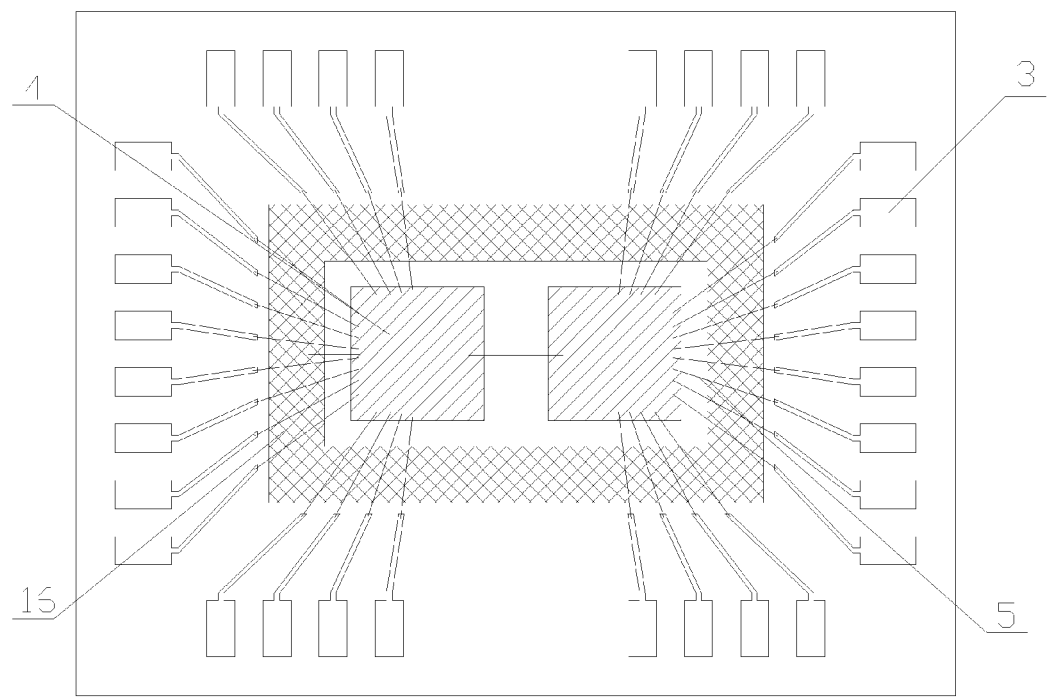
FIG. 38B is a top view of the exemplary no-exposed-pad BGA packaging structure of FIG. 38A.

FIG. 38A and FIG. 38B illustrate another exemplary no-exposed-pad BGA packaging structure. FIG. 38A is a cross-sectional view of FIG. 38B.

As shown in FIG. 38A and FIG. 38B, the no-exposed-pad BGA packaging structure in FIG. 38A and FIG. 38B is similar to the no-exposed-pad BGA packaging structure in FIG. 37A and FIG. 37B. However, the no-exposed-pad BGA packaging structure in FIGS. 38A and 38B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad BGA packaging structure with multiple dies, multiple inner die pads, a single lead ring, and electrostatic discharge rings may be formed.

Figure 39A:
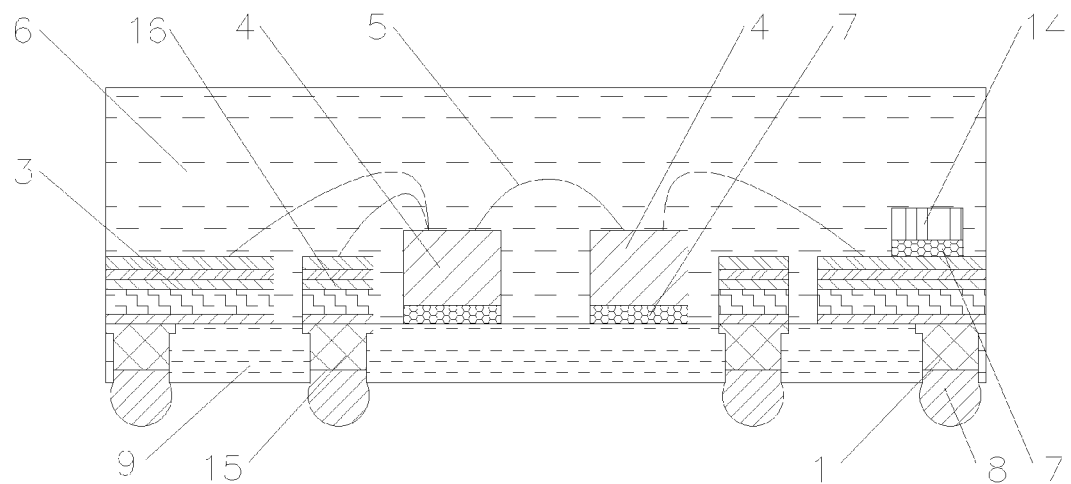
FIG. 39A is a cross-sectional view of another exemplary no-exposed-pad BGA packaging structure consistent with the disclosed embodiments.
Figure 39B:
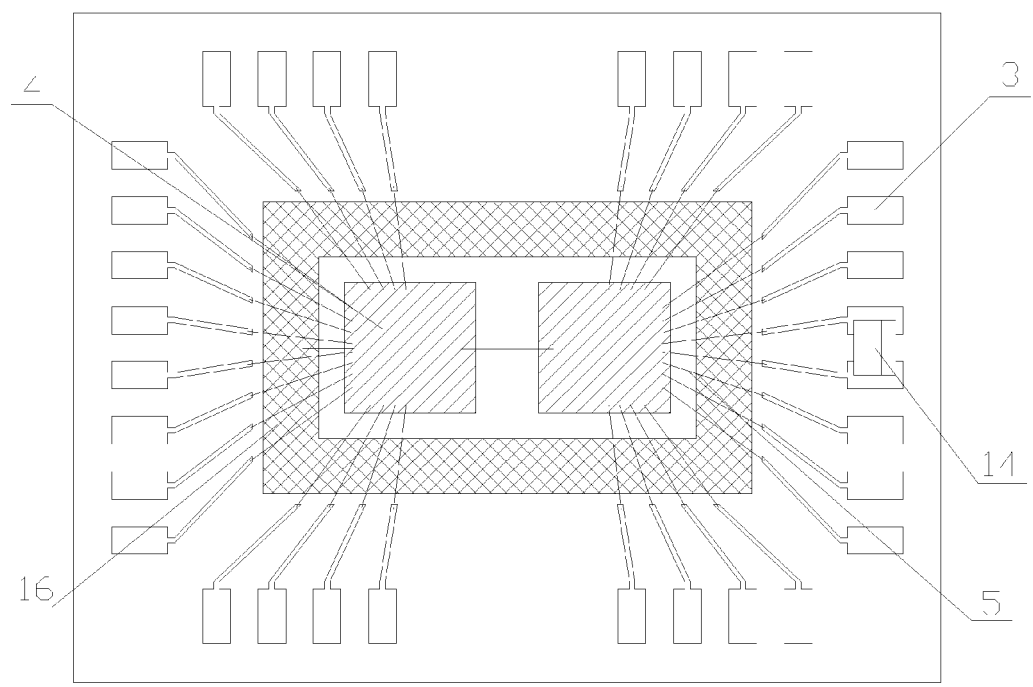
FIG. 39B is a top view of the exemplary no-exposed-pad BGA packaging structure of FIG. 39A.

FIG. 39A and FIG. 39B illustrate another exemplary no-exposed-pad BGA packaging structure. FIG. 39A is a cross-sectional view of FIG. 39B.

As shown in FIG. 39A and FIG. 39B, the no-exposed-pad BGA packaging structure in FIG. 39A and FIG. 39B is similar to the no-exposed-pad BGA packaging structure in FIG. 23A and FIG. 23B. However, the no-exposed-pad BGA packaging structure in FIGS. 39A and 39B includes a plurality of dies 4. Each of the plurality of dies 4 is attached on predetermined areas on the substrate or other planar supporting structure or within the ring or rings of inner leads 3 by conductive or non-conductive adhesive material 7. For example, a second die 4 is arranged in a side-by-side configuration with respect to the first die 4, and both dies 4 are arranged within the ring or rings of inner leads 3. Further, the top surface of each die 4 may be connected by metal wires 5. Other configurations may also be used. Thus, a no-exposed-pad BGA packaging structure with multiple dies, single lead ring coupled with passive devices, and electrostatic discharge rings may be formed.

Figure 40A:
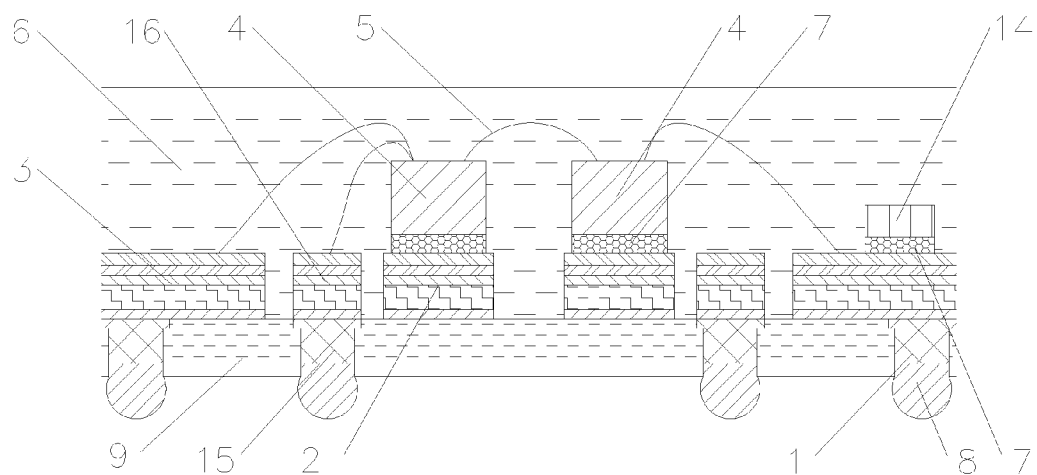
FIG. 40A is a cross-sectional view of another exemplary no-exposed-pad BGA packaging structure consistent with the disclosed embodiments.
Figure 40B:
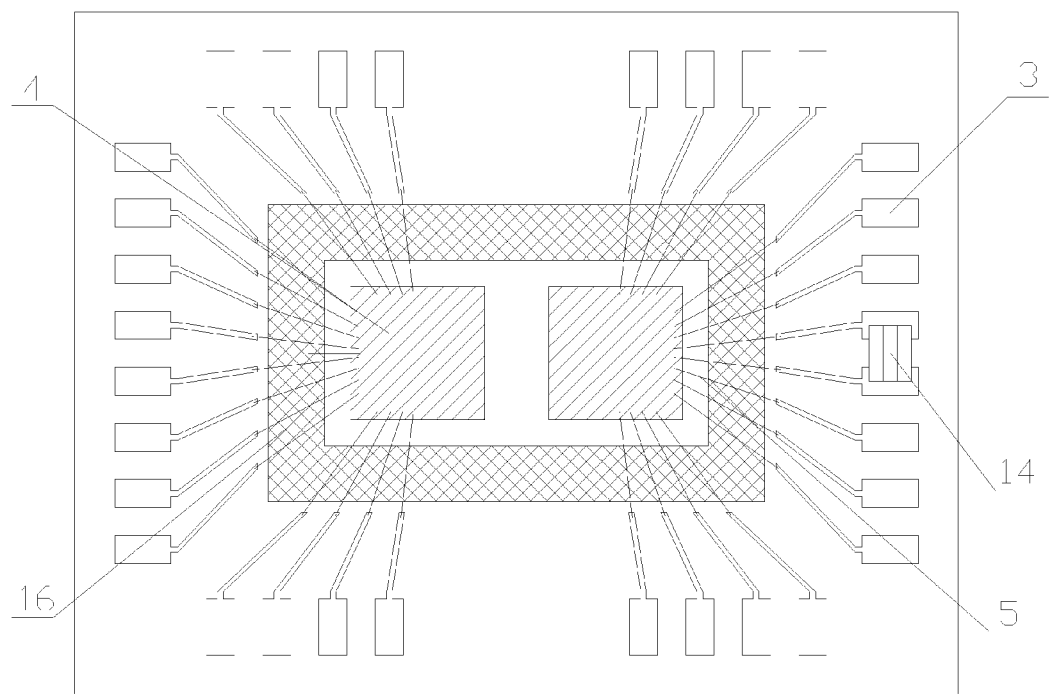
FIG. 40B is a top view of the exemplary no-exposed-pad BGA packaging structure of FIG. 40A.

FIG. 40A and FIG. 40B illustrate another exemplary no-exposed-pad BGA packaging structure. FIG. 40A is a cross-sectional view of FIG. 40B.

As shown in FIG. 40A and FIG. 40B, the no-exposed-pad BGA packaging structure in FIG. 40A and FIG. 40B is similar to the no-exposed-pad BGA packaging structure in FIG. 39A and FIG. 39B. However, the no-exposed-pad BGA packaging structure in FIGS. 40A and 40B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad BGA packaging structure with multiple dies, multiple inner die pads, a single lead ring coupled with passive devices, and electrostatic discharge rings may be formed.

Figure 41A:
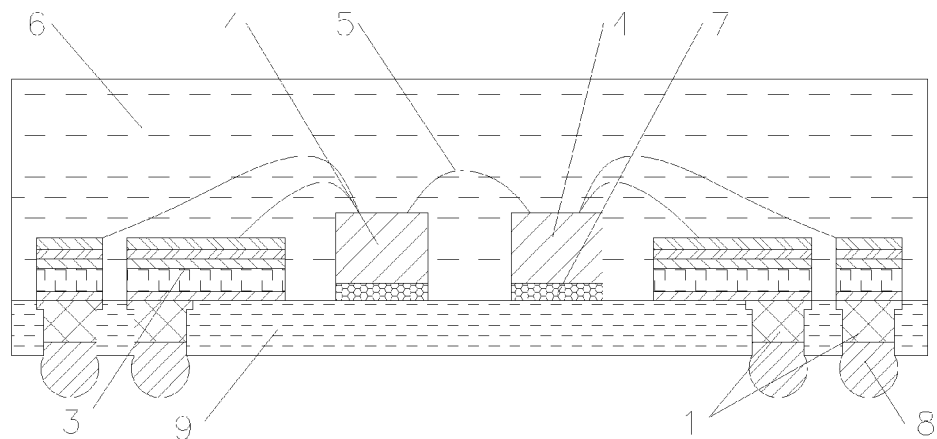
FIG. 41A is a cross-sectional view of another exemplary no-exposed-pad BGA packaging structure consistent with the disclosed embodiments.
Figure 41B:
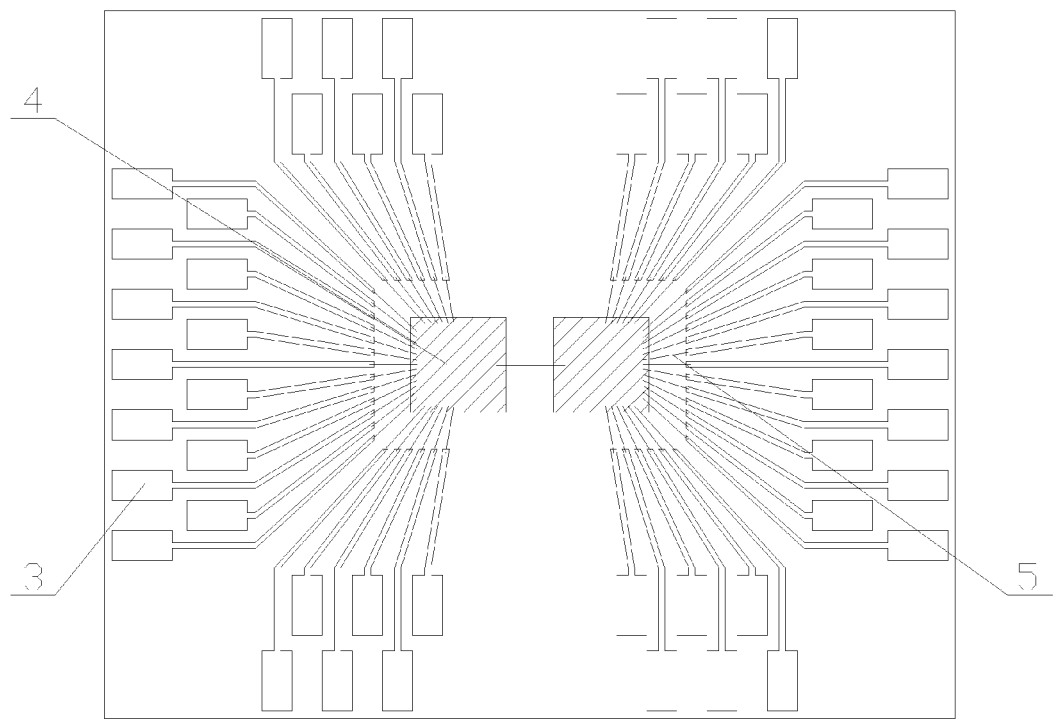
FIG. 41B is a top view of the exemplary no-exposed-pad BGA packaging structure of FIG. 41A.

FIG. 41A and FIG. 41B illustrate another exemplary no-exposed-pad BGA packaging structure. FIG. 41A is a cross-sectional view of FIG. 41B.

As shown in FIG. 41A and FIG. 41B, the no-exposed-pad BGA packaging structure in FIG. 41A and FIG. 41B is similar to the no-exposed-pad BGA packaging structure in FIG. 33A and FIG. 33B. However, the no-exposed-pad BGA packaging structure in FIGS. 41A and 41B includes multiple rings of outer leads 1. In other words, outer leads 1 are arranged in a multiple-ring configuration. Further, multiple rings of inner leads 3 may be formed on the top surface of the outer leads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings may be significantly reduced. Thus, a no-exposed-pad BGA packaging structure with multiple dies and multiple lead rings may be formed.

Figure 42A:
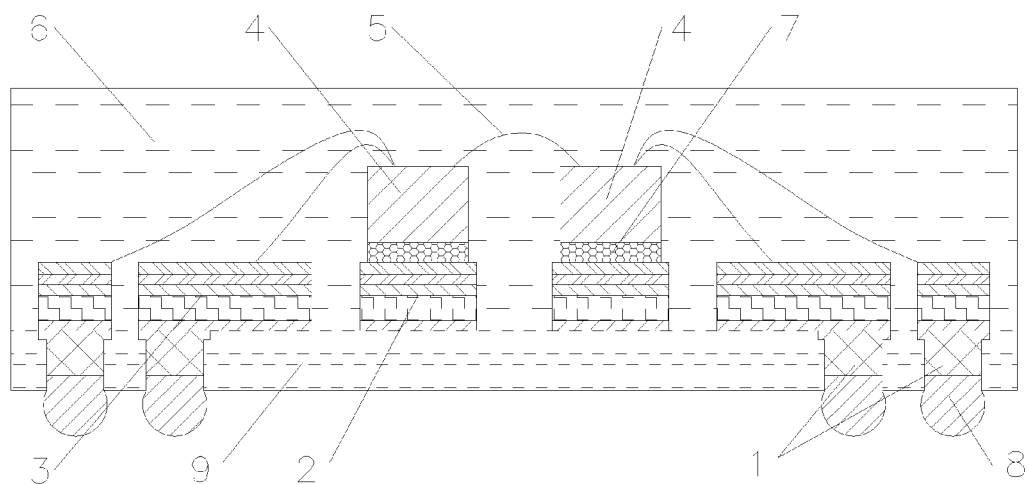
FIG. 42A is a cross-sectional view of another exemplary no-exposed-pad BGA packaging structure consistent with the disclosed embodiments.
Figure 42B:
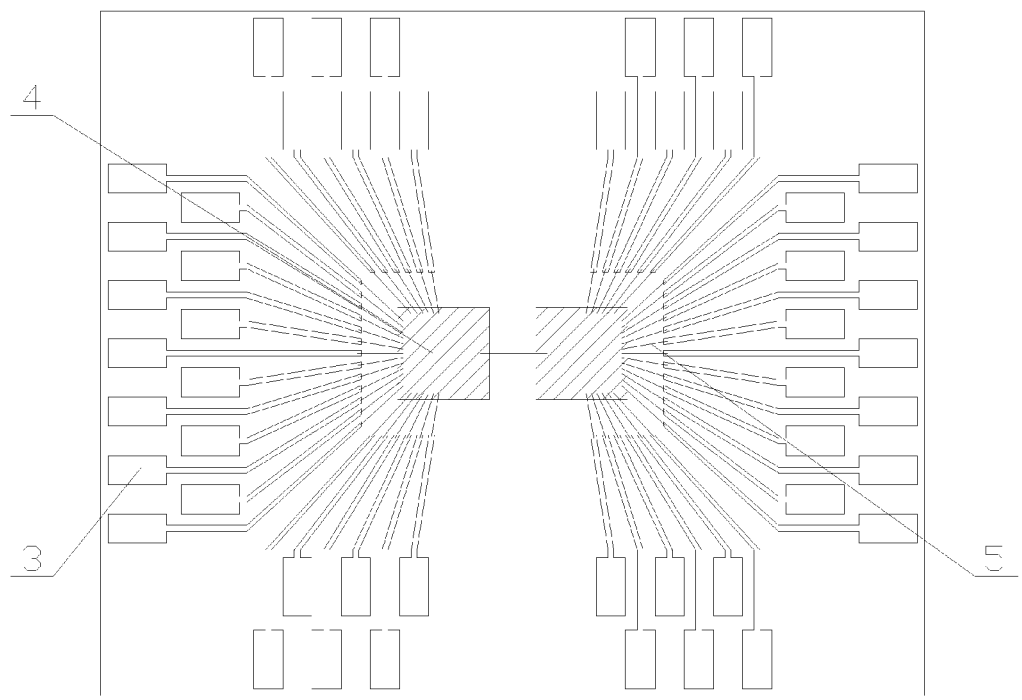
FIG. 42B is a top view of the exemplary no-exposed-pad BGA packaging structure of FIG. 42A.

FIG. 42A and FIG. 42B illustrate another exemplary no-exposed-pad BGA packaging structure. FIG. 42A is a cross-sectional view of FIG. 42B.

As shown in FIG. 42A and FIG. 42B, the no-exposed-pad BGA packaging structure in FIG. 42A and FIG. 42B is similar to the no-exposed-pad BGA packaging structure in FIG. 41A and FIG. 41B. However, the no-exposed-pad BGA packaging structure in FIGS. 42A and 42B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad BGA packaging structure with multiple dies, multiple inner die pads, and multiple lead rings may be formed.

Figure 43A:
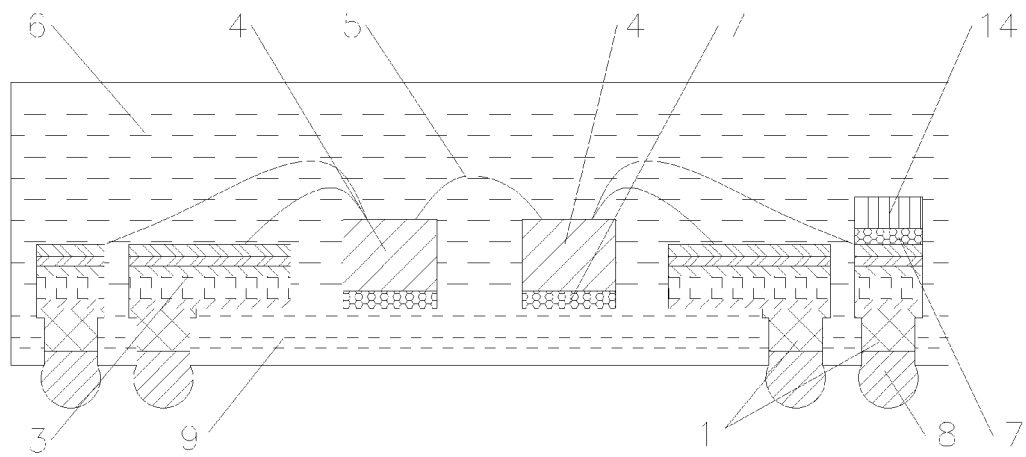
FIG. 43A is a cross-sectional view of another exemplary no-exposed-pad BGA packaging structure consistent with the disclosed embodiments.
Figure 43B:
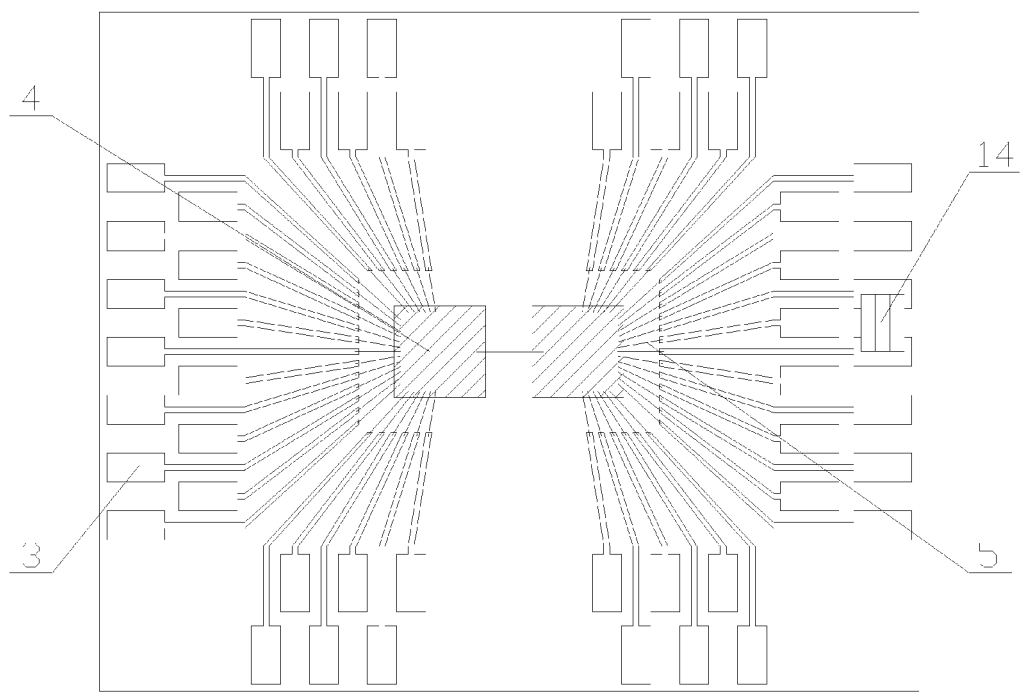
FIG. 43B is a top view of the exemplary no-exposed-pad BGA packaging structure of FIG. 43A.

FIG. 43A and FIG. 43B illustrate another exemplary no-exposed-pad BGA packaging structure. FIG. 43A is a cross-sectional view of FIG. 43B.

As shown in FIG. 43A and FIG. 43B, the no-exposed-pad BGA packaging structure in FIG. 43A and FIG. 43B is similar to the no-exposed-pad BGA packaging structure in FIG. 35A and FIG. 35B. However, the no-exposed-pad BGA packaging structure in FIGS. 43A and 43B includes multiple rings of outer leads 1. In other words, outer leads 1 are arranged in a multiple-ring configuration. Further, multiple rings of inner leads 3 may be formed on the top surface of the outer leads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings may be significantly reduced. Thus, a no-exposed-pad BGA packaging structure with multiple dies and multiple lead rings coupled with passive devices may be formed.

Figure 44A:
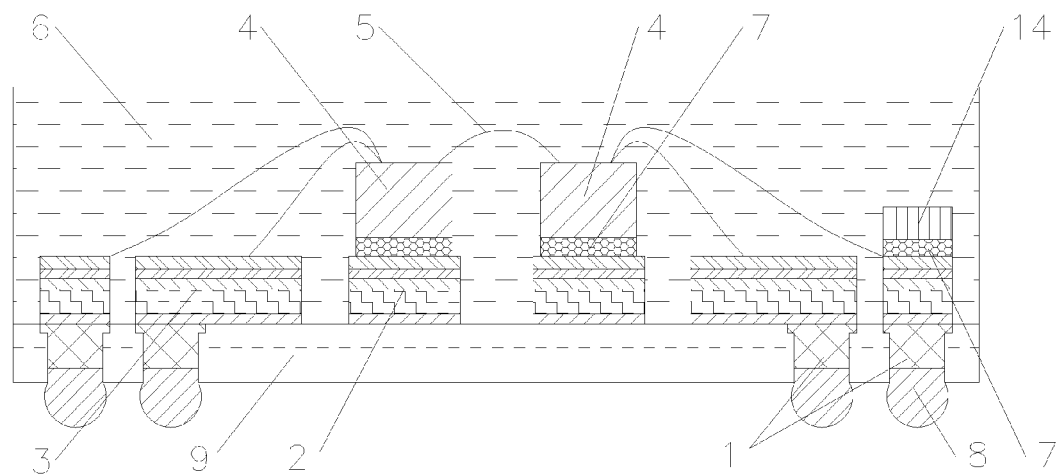
FIG. 44A is a cross-sectional view of another exemplary no-exposed-pad BGA packaging structure consistent with the disclosed embodiments.
Figure 44B:
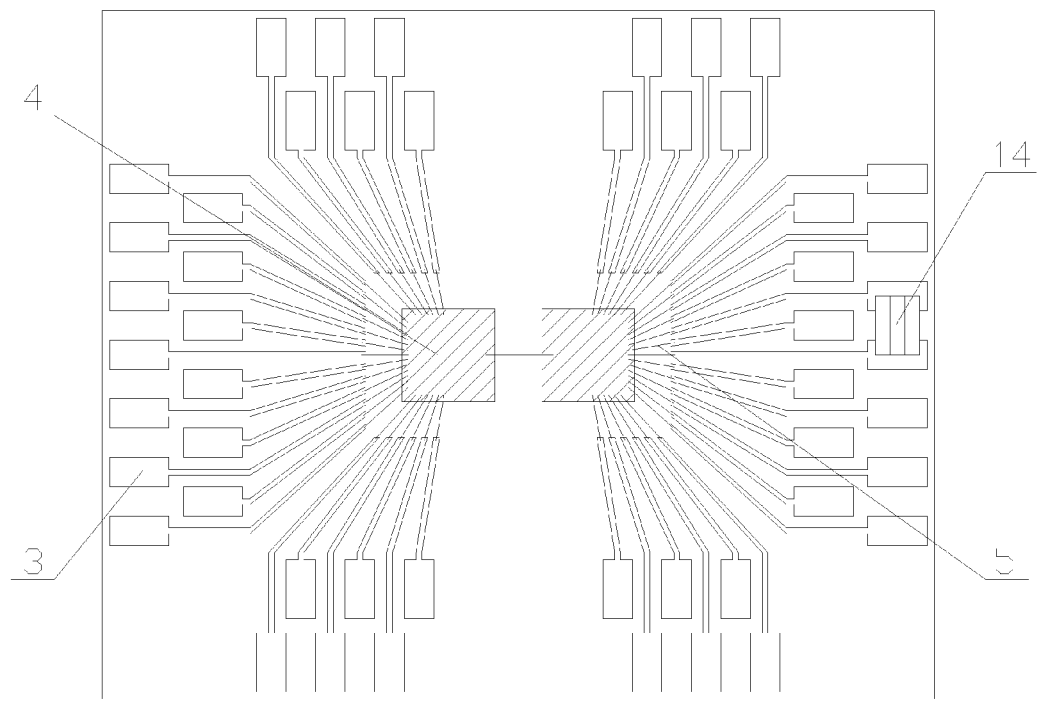
FIG. 44B is a top view of the exemplary no-exposed-pad BGA packaging structure of FIG. 44A.

FIG. 44A and FIG. 44B illustrate another exemplary no-exposed-pad BGA packaging structure. FIG. 44A is a cross-sectional view of FIG. 44B.

As shown in FIG. 44A and FIG. 44B, the no-exposed-pad BGA packaging structure in FIG. 44A and FIG. 44B is similar to the no-exposed-pad BGA packaging structure in FIG. 43A and FIG. 43B. However, the no-exposed-pad BGA packaging structure in FIGS. 44A and 44B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad BGA packaging structure with multiple dies, multiple inner die pads, and multiple lead rings coupled with passive devices may be formed.

Figure 45A:
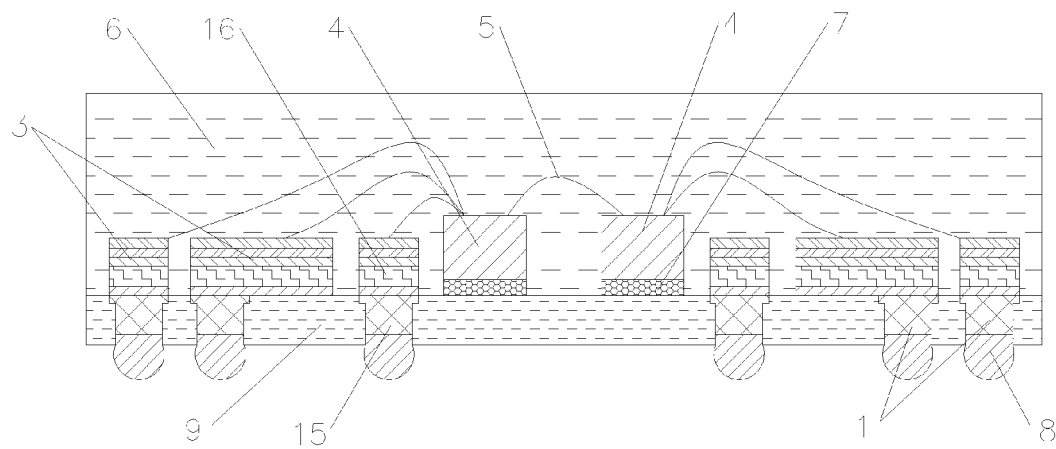
FIG. 45A is a cross-sectional view of another exemplary no-exposed-pad BGA packaging structure consistent with the disclosed embodiments.
Figure 45B:
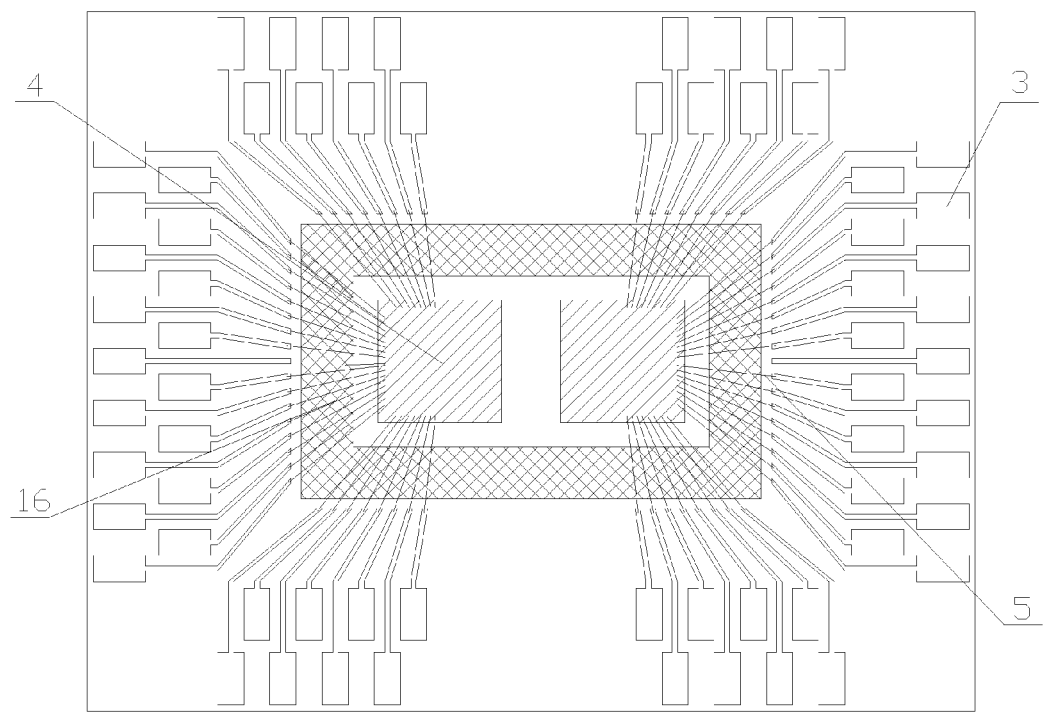
FIG. 45B is a top view of the exemplary no-exposed-pad BGA packaging structure of FIG. 45A.

FIG. 45A and FIG. 45B illustrate another exemplary no-exposed-pad BGA packaging structure. FIG. 45A is a cross-sectional view of FIG. 45B.

As shown in FIG. 45A and FIG. 45B, the no-exposed-pad BGA packaging structure in FIG. 45A and FIG. 45B is similar to the no-exposed-pad BGA packaging structure in FIG. 37A and FIG. 37B. However, the no-exposed-pad BGA packaging structure in FIGS. 45A and 45B includes multiple rings of outer leads 1. In other words, outer leads 1 are arranged in a multiple-ring configuration. Further, multiple rings of inner leads 3 may be formed on the top surface of the outer leads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings may be significantly reduced. Thus, a no-exposed-pad BGA packaging structure with multiple dies, multiple lead rings, and electrostatic discharge rings may be formed.

Figure 46A:
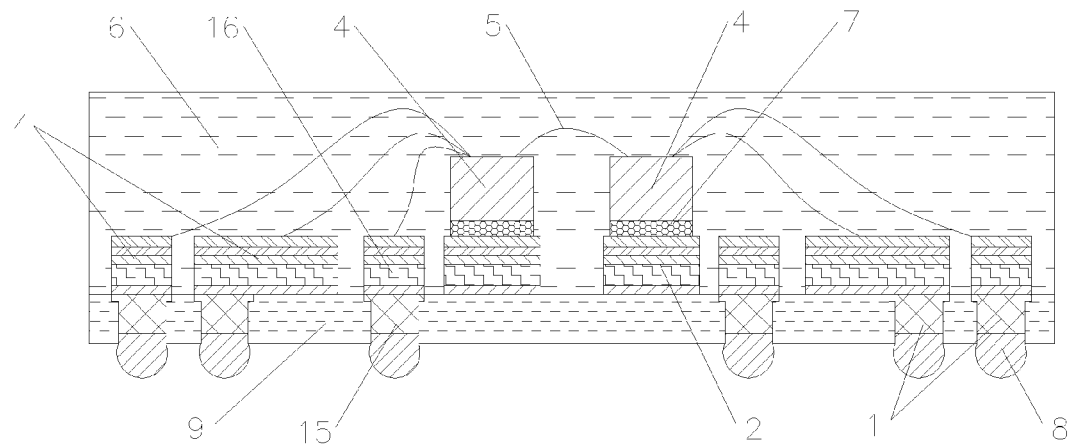
FIG. 46A is a cross-sectional view of another exemplary no-exposed-pad BGA packaging structure consistent with the disclosed embodiments.
Figure 46B:
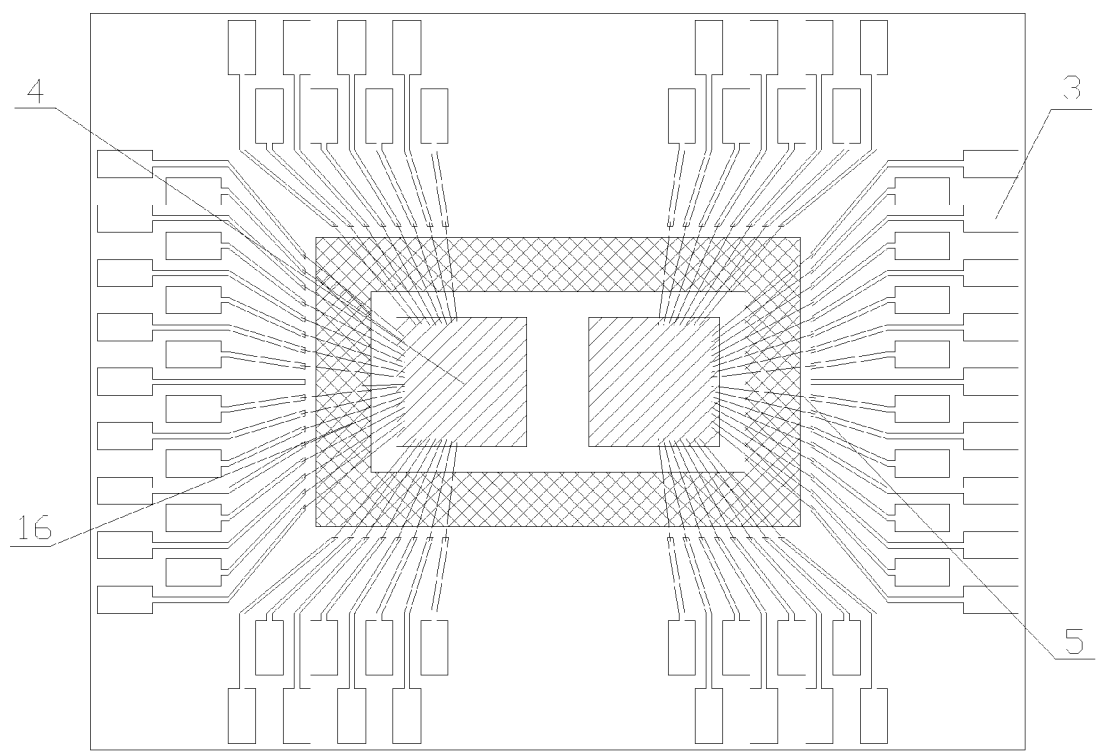
FIG. 46B is a top view of the exemplary no-exposed-pad BGA packaging structure of FIG. 46A.

FIG. 46A and FIG. 46B illustrate another exemplary no-exposed-pad BGA packaging structure. FIG. 46A is a cross-sectional view of FIG. 46B.

As shown in FIG. 46A and FIG. 46B, the no-exposed-pad BGA packaging structure in FIG. 46A and FIG. 46B is similar to the no-exposed-pad BGA packaging structure in FIG. 45A and FIG. 45B. However, the no-exposed-pad BGA packaging structure in FIGS. 46A and 46B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad BGA packaging structure with multiple dies, multiple inner die pads, multiple lead rings, and electrostatic discharge rings may be formed.

Figure 47A:
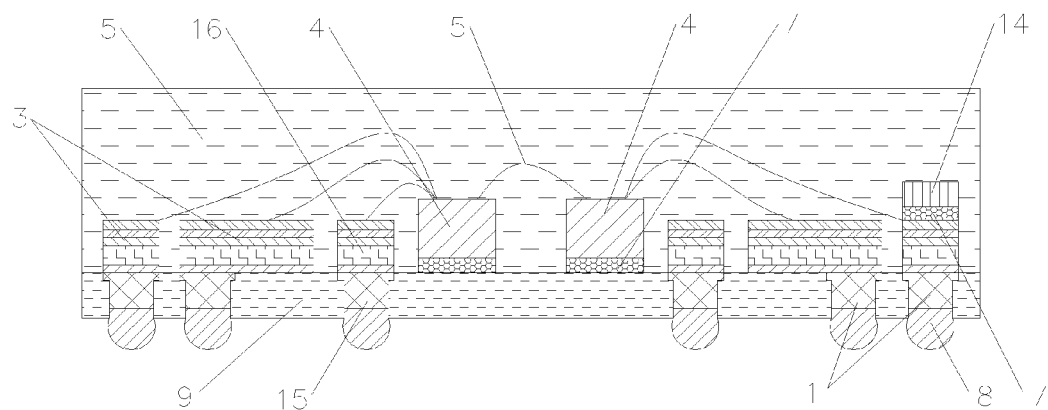
FIG. 47A is a cross-sectional view of another exemplary no-exposed-pad BGA packaging structure consistent with the disclosed embodiments.
Figure 47B:
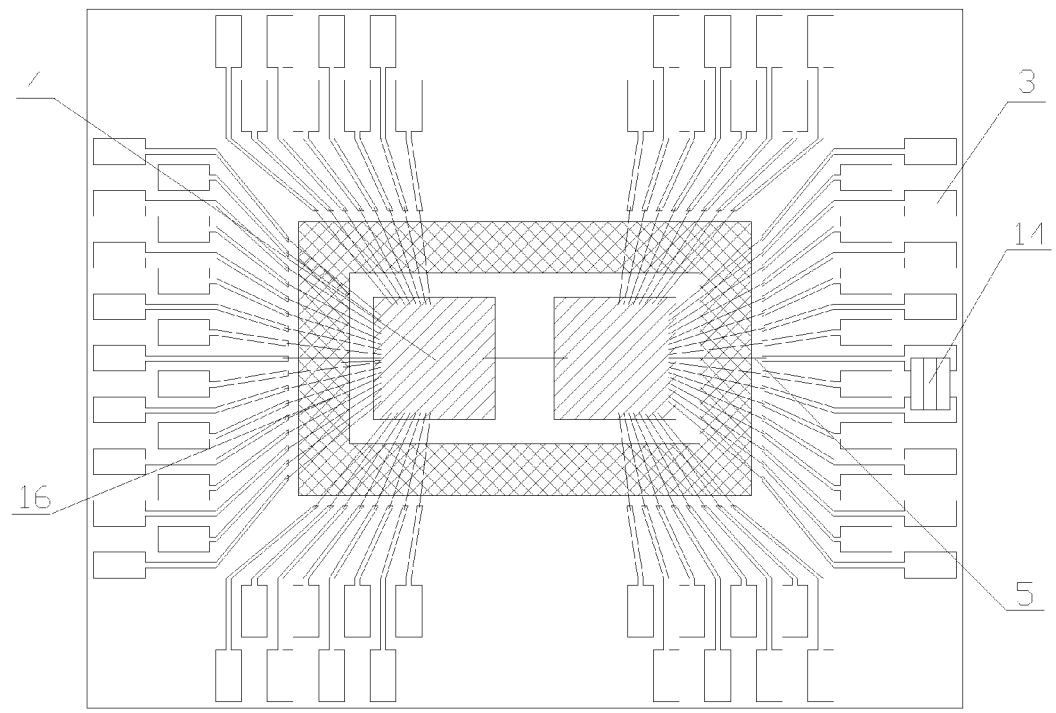
FIG. 47B is a top view of the exemplary no-exposed-pad BGA packaging structure of FIG. 47A.

FIG. 47A and FIG. 47B illustrate another exemplary no-exposed-pad BGA packaging structure. FIG. 47A is a cross-sectional view of FIG. 47B.

As shown in FIG. 47A and FIG. 47B, the no-exposed-pad BGA packaging structure in FIG. 47A and FIG. 47B is similar to the no-exposed-pad BGA packaging structure in FIG. 39A and FIG. 39B. However, the no-exposed-pad BGA packaging structure in FIGS. 47A and 47B includes multiple rings of outer leads 1. In other words, outer leads 1 are arranged in a multiple-ring configuration. Further, multiple rings of inner leads 3 may be formed on the top surface of the outer leads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings may be significantly reduced. Thus, a no-exposed-pad BGA packaging structure with multiple dies, multiple lead rings coupled with passive devices, and electrostatic discharge rings may be formed.

Figure 48A:
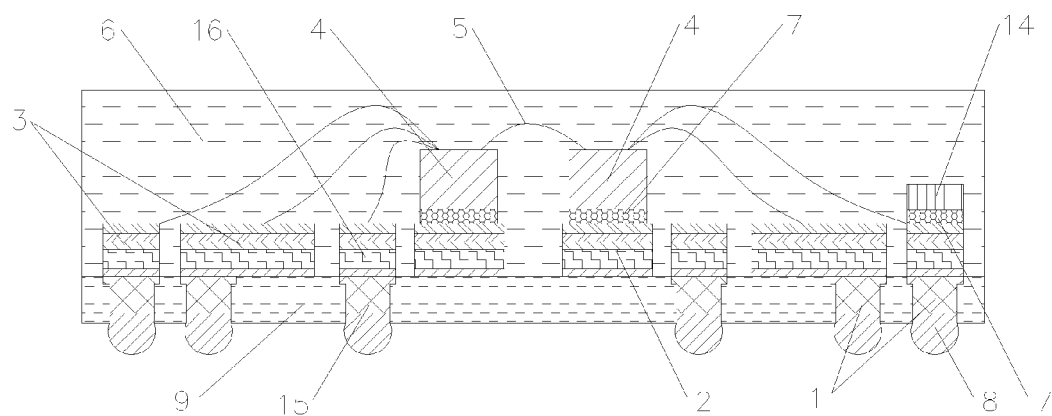
FIG. 48A is a cross-sectional view of another exemplary no-exposed-pad BGA packaging structure consistent with the disclosed embodiments.
Figure 48B:
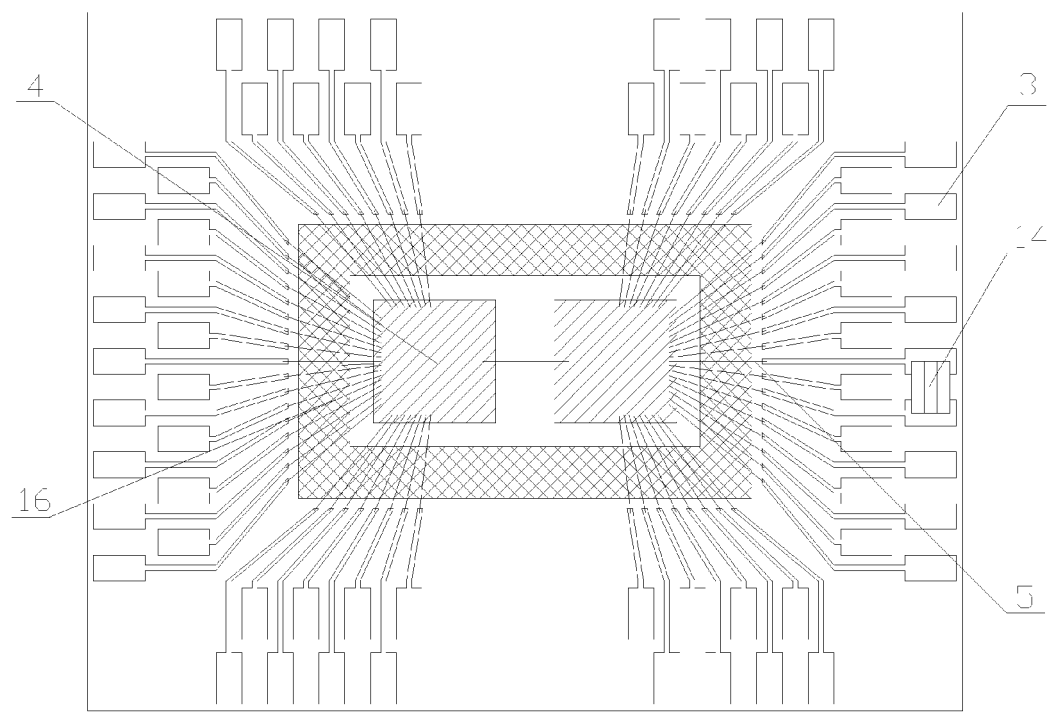
FIG. 48B is a top view of the exemplary no-exposed-pad BGA packaging structure of FIG. 48A.
Figure 49:
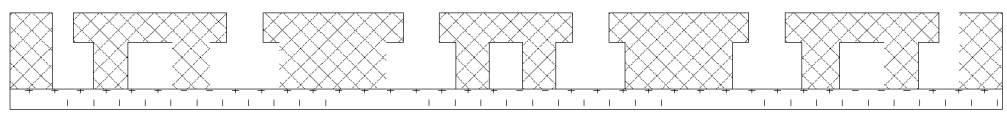
FIG. 49 shows a high-temperature resistant film affixed on a lead frame.
Figure 50:
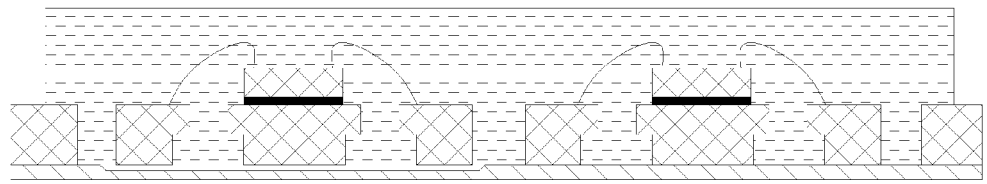
FIG. 50 shows molding material infiltrated the high-temperature resistant film affixed on the lead frame.
Figure 51:
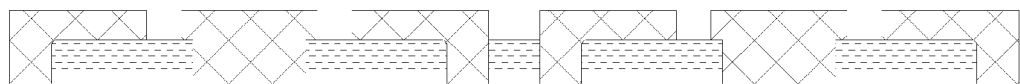
FIG. 51 shows a two-side etched lead frame.

FIG. 48A and FIG. 48B illustrate another exemplary no-exposed-pad BGA packaging structure. FIG. 48A is a cross-sectional view of FIG. 48B.

As shown in FIG. 48A and FIG. 48B, the no-exposed-pad BGA packaging structure in FIG. 48A and FIG. 48B is similar to the no-exposed-pad BGA packaging structure in FIG. 47A and FIG. 47B. However, the no-exposed-pad BGA packaging structure in FIGS. 48A and 48B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad BGA packaging structure with multiple dies, multiple inner die pads, multiple lead rings coupled with passive devices, and electrostatic discharge ring may be formed.

By using the disclosed methods, processes, and devices, various advantageous applications may be implemented. For example, using the disclosed processes and devices, separate etching processes on both sides of the metal substrate can be avoided, and the process cost, time, personnel, power, and materials can be reduced. At the same time, the amount of potential environment-harmful substances generated in the etching processes can also be reduced. Further, because the use of the thin-line plating method on the top surface of the substrate, the minimum width of the inner leads may be approximately 25 μm, and the lead pitch of the inner leads may be as small as approximately 25 μm. Thus, the lead density in the lead frame can be significantly increased.

By using the disclosed processes and devices, only lead frame is involved in the die attaching process and wire bonding process. Thus, the lead frame may be tolerant substantially high temperature, such as in a range of approximately 380-420 Celsius degrees, without warping. Further, when the no-exposed-pad BGA packaging structure is surface-mounted on a PCB board, because the outer leads and the die pad are implanted or coated with solder balls, the distance between the back surface of the packaging body and the PCB board is increased. Thus, the problem of being unable to melt solder in the outer lead area or the die pad area by hot air is less likely to happen. In addition, such structures may make rework much easier when the packaging structure is not well mounted on the PCB board.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for manufacturing a ball grid array (BGA) packaging structure, the method comprising:
   providing a metal substrate;
   forming a first photoresist film on a top surface of the metal substrate;
   forming a plating pattern in the first photoresist film using photolithography;
   forming a metal layer containing a plurality of inner leads by a multi-layer electrical plating process using the plating pattern in the first photoresist film as a mask, such that a lead pitch of the plurality of inner leads is significantly reduced;
   attaching at least one die in a predetermined region on the top surface of the metal substrate;
   connecting the die and the plurality of inner leads using metal wires by a wire bonding process;
   sealing the die, the plurality of inner leads, and metal wires with a molding compound;
   etching the metal substrate from a bottom surface of the metal substrate to form a plurality of outer leads corresponding to the plurality of inner leads; and
   attaching a plurality of solder balls to a back surface of the plurality of outer leads;
   wherein
   etching the metal substrate further comprises: forming a third photoresist film on the bottom surface of the metal substrate; forming an etching pattern in the third photoresist film using photolithography; and etching the metal substrate using the etching pattern in the third photoresist film on the bottom surface of the metal substrate; and
   forming the third photoresist further comprises: forming a fourth photoresist film on the top surface of the metal substrate including the encapsulation material to protect the metal substrate from the etching process.

2. The method of claim 1, wherein etching the metal substrate further comprises:
   removing the third photoresist film and the fourth photoresist film after the metal substrate is etched.

3. A method for manufacturing a ball grid array (BGA) packaging structure, the method comprising:
   providing a metal substrate;
   forming a first photoresist film on a top surface of the metal substrate;
   forming a plating pattern in the first photoresist film using photolithography;
   forming a metal layer containing a plurality of inner leads by a multi-layer electrical plating process using the plating pattern in the first photoresist film as a mask, such that a lead pitch of the plurality of inner leads is significantly reduced;
   attaching at least one die in a predetermined region on the top surface of the metal substrate;
   connecting the die and the plurality of inner leads using metal wires by a wire bonding process;
   sealing the die, the plurality of inner leads, and metal wires with a molding compound;
   etching the metal substrate from a bottom surface of the metal substrate to form a plurality of outer leads corresponding to the plurality of inner leads; and
   attaching a plurality of solder balls to a back surface of the plurality of outer leads;
   wherein
   attaching the plurality of solder balls further comprises: micro-etching the back surface of the plurality of outer leads; and attaching the plurality of solder balls on the micro-etched back surface of the plurality of outer leads.

4. The method of claim 3, further comprising forming an inner die pad by the multi-layer electrical plating process, wherein the die is attached to the inner die pad by an adhesive material.

5. The method of claim 3, wherein:
   the plurality of outer leads is arranged in a single-ring configuration; and
   the plurality of inner leads is arranged in a corresponding single-ring configuration.

6. A method for manufacturing a ball grid array (BGA) packaging structure, the method comprising:
   providing a metal substrate;
   forming a first photoresist film on a top surface of the metal substrate;
   forming a plating pattern in the first photoresist film using photolithography;
   forming a metal layer containing a plurality of inner leads by a multi-layer electrical plating process using the plating pattern in the first photoresist film as a mask, such that a lead pitch of the plurality of inner leads is significantly reduced;
   attaching at least one die in a predetermined region on the top surface of the metal substrate;
   connecting the die and the plurality of inner leads using metal wires by a wire bonding process;
   sealing the die, the plurality of inner leads, and metal wires with a molding compound;
   etching the metal substrate from a bottom surface of the metal substrate to form a plurality of outer leads corresponding to the plurality of inner leads; and
   attaching a plurality of solder balls to a back surface of the plurality of outer leads;
   wherein:
   the plurality of outer leads is arranged in a multi-ring configuration; and
   the plurality of inner leads is arranged in a corresponding multi-ring configuration.

* * * * *